(12) United States Patent
Nishikawa et al.

(10) Patent No.: US 7,902,588 B2
(45) Date of Patent: Mar. 8, 2011

(54) NONVOLATILE SEMICONDUCTOR MEMORY DEVICE AND METHOD FOR MANUFACTURING THE SAME

(75) Inventors: Yukie Nishikawa, Kitakyusyu (JP); Akira Takashima, Fuchu (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 535 days.

(21) Appl. No.: 11/846,251

(22) Filed: Aug. 28, 2007

(65) Prior Publication Data

US 2008/0121979 A1    May 29, 2008

(30) Foreign Application Priority Data

Nov. 27, 2006  (JP) ................................ 2006-318627

(51) Int. Cl.
*H01L 29/788*     (2006.01)

(52) U.S. Cl. .. 257/321; 257/316; 257/411; 257/E29.129; 257/E29.132; 257/E29.162

(58) Field of Classification Search .......... 257/314–316, 257/321, 324, 325, 411, E29.129, E29.132, 257/E29.3, E29.162, E29.165
See application file for complete search history.

(56) References Cited

U.S. PATENT DOCUMENTS

| | | | |
|---|---|---|---|
| 2002/0137317 A1 | 9/2002 | Kaushik et al. | |
| 2003/0207540 A1 | 11/2003 | Ahn et al. | |
| 2005/0242387 A1* | 11/2005 | Forbes ......................... | 257/314 |
| 2006/0157754 A1 | 7/2006 | Jeon et al. | |

FOREIGN PATENT DOCUMENTS

| | | |
|---|---|---|
| CN | 1582499 A | 2/2005 |
| CN | 1825628 A | 8/2006 |
| JP | 11-297867 | 10/1999 |
| KR | 10-2006-0113478 | 11/2006 |

OTHER PUBLICATIONS

L. Yan et al., "The effect of ultra-thin $Al_2O_3$ layers on the dielectric properties of $LaAlO_3$ thin film on silicon", Semicond. Sci. Technol., 19, Jun. 8, 2004, pp. 935-938.

* cited by examiner

*Primary Examiner* — Matthew E Warren
(74) *Attorney, Agent, or Firm* — Oblon, Spivak, McClelland, Maier & Neustadt, L.L.P.

(57) ABSTRACT

A nonvolatile semiconductor memory device includes: a tunneling insulating film; a floating gate electrode; an inter-electrode insulating film, in which an interface facing the floating gate electrode and an interface facing a control gate electrode are defined as the first interface and the second interface, respectively; and a control gate electrode. The inter-electrode insulating film includes one or more first elements selected from rare earth elements, one or more second elements selected from Al, Ti, Zr, Hf, Ta, Mg, Ca, Sr and Ba, and oxygen. A composition ratio of the first element, which is defined as the number of atoms of the first element divided by that of the second element, is changed between the first interface and the second interface, and the composition ratio in the vicinity of the first interface is lower than that in the vicinity of the second interface.

20 Claims, 22 Drawing Sheets

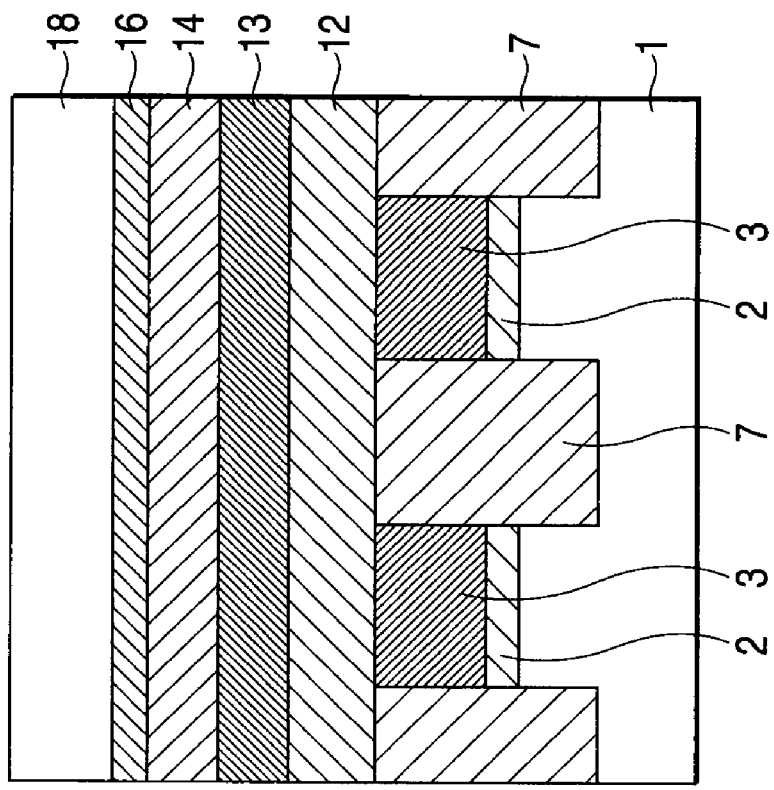
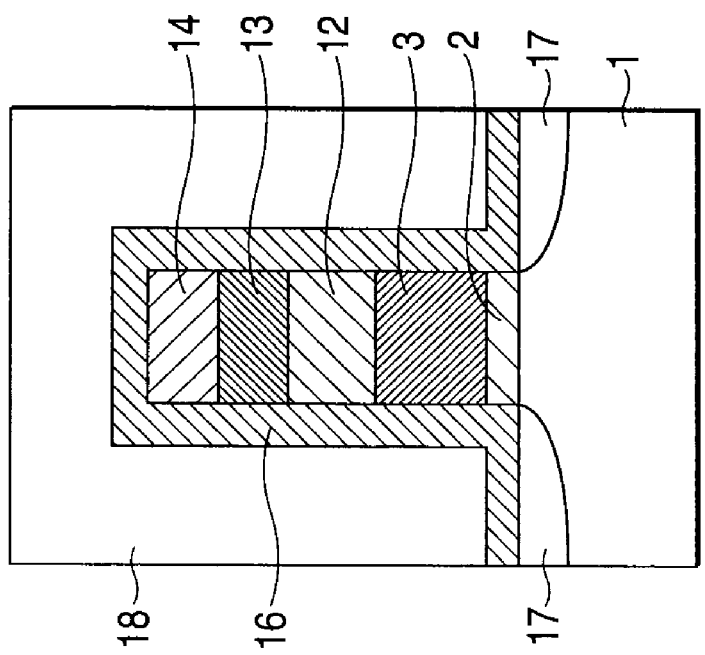

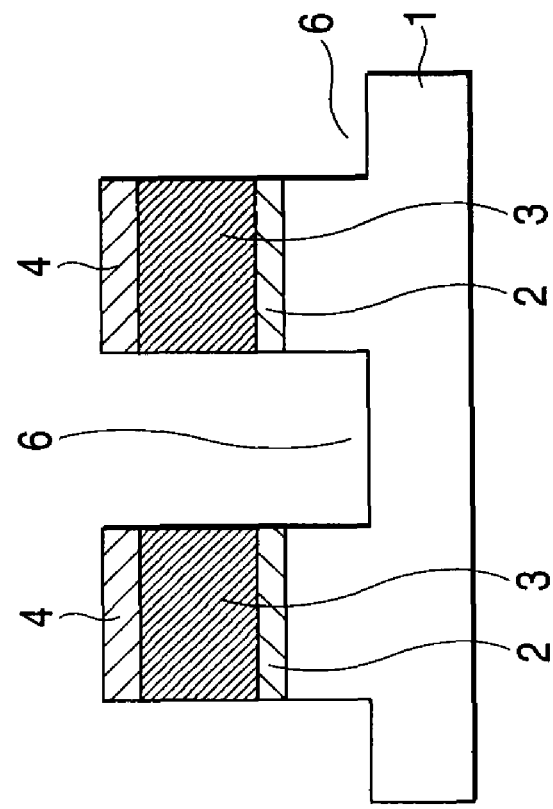
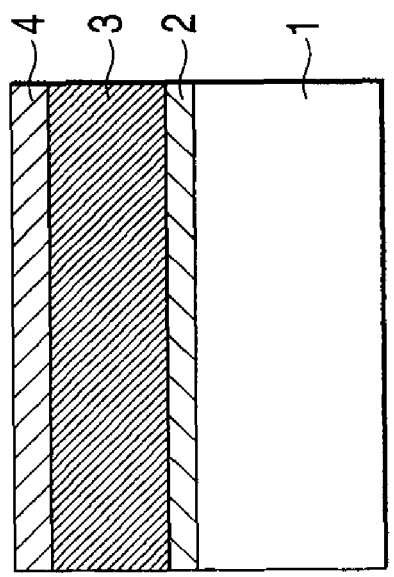

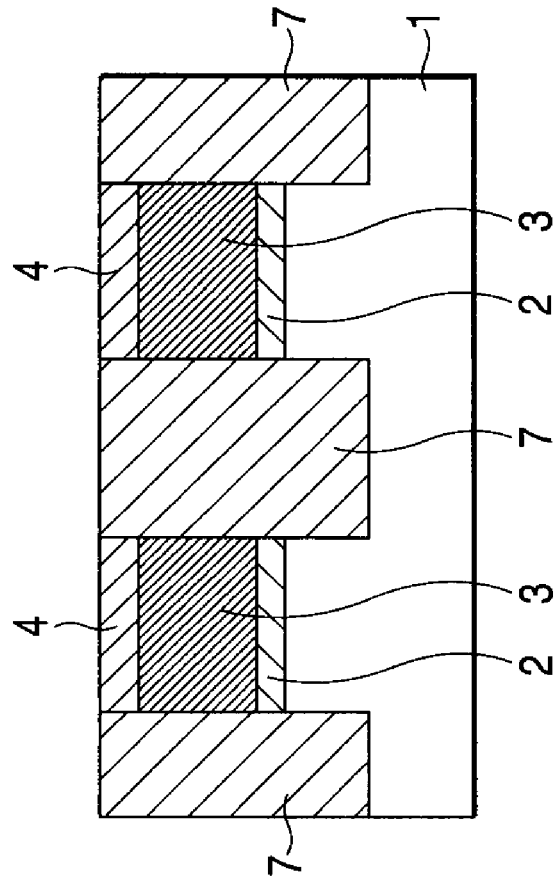
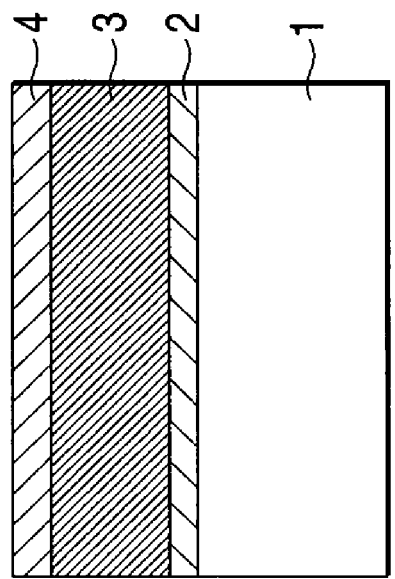

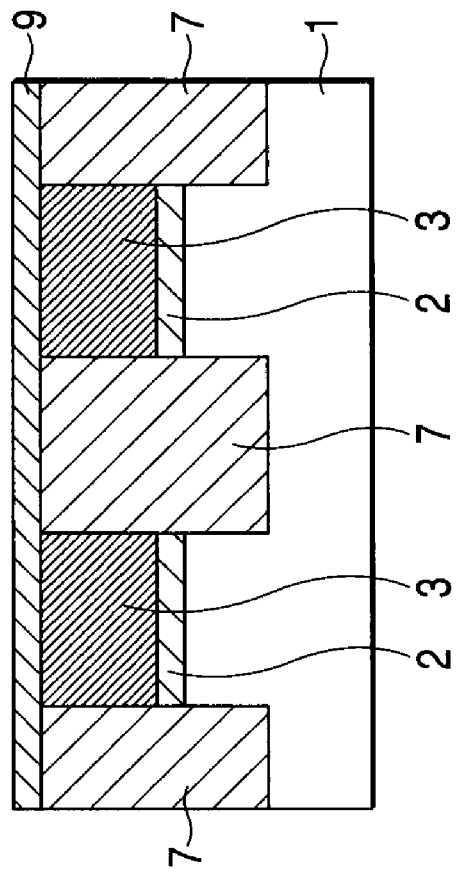
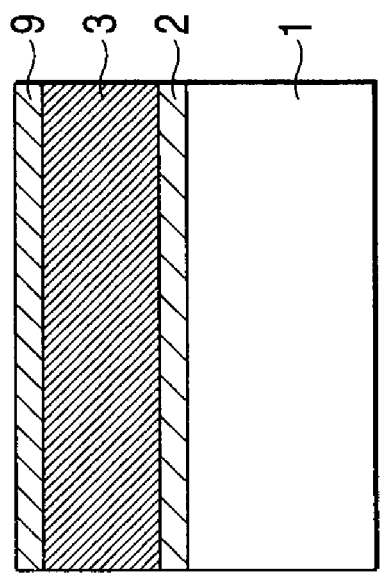

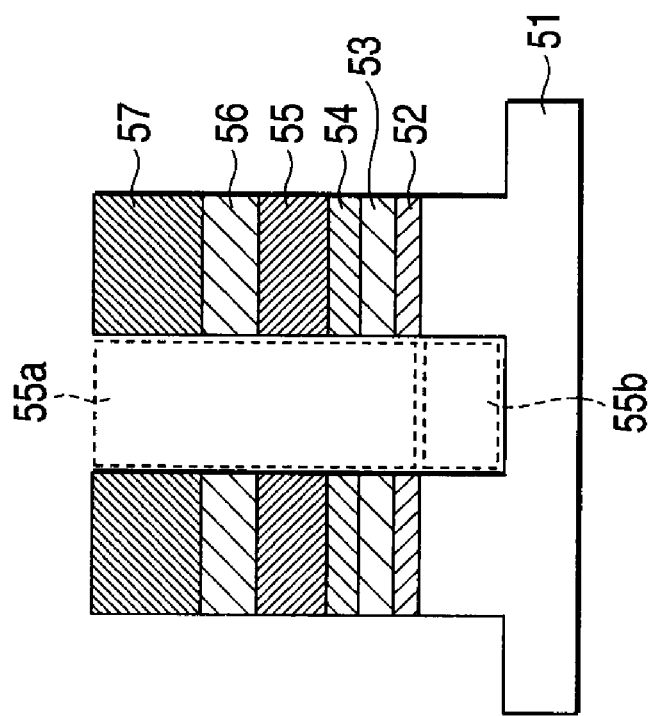
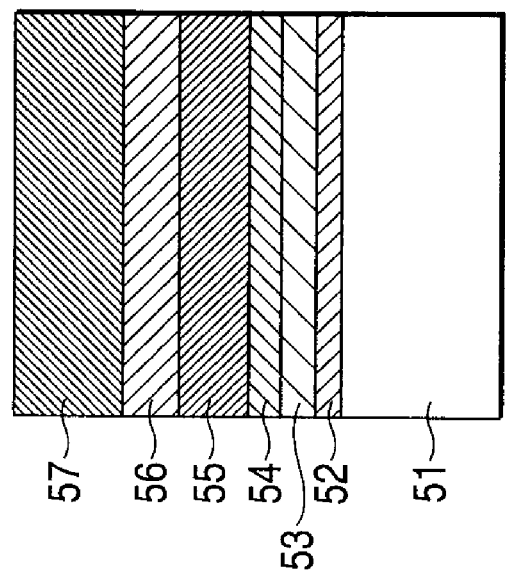

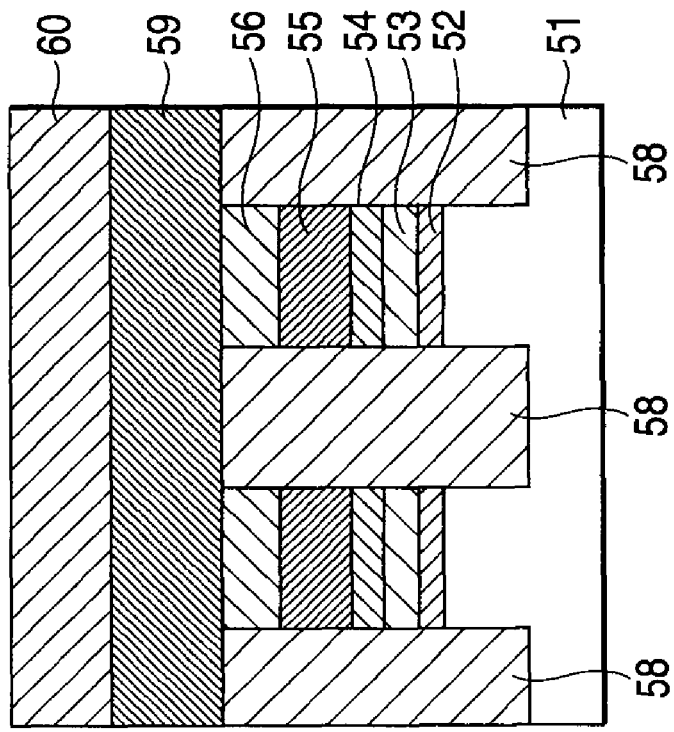
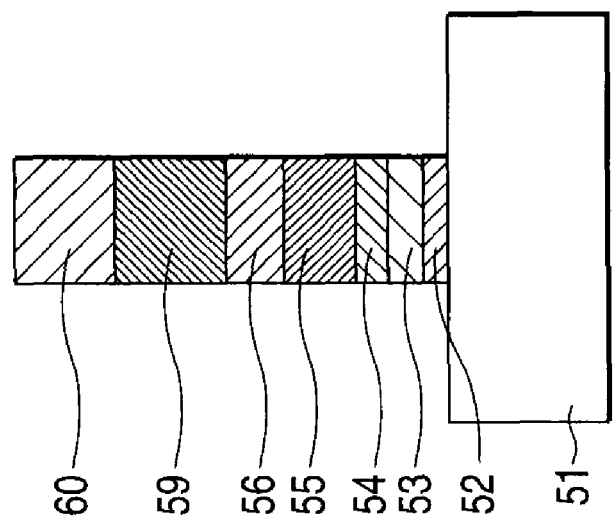

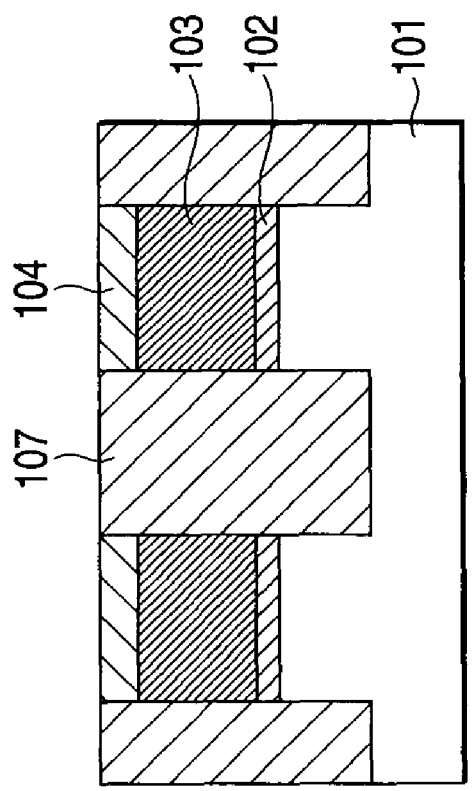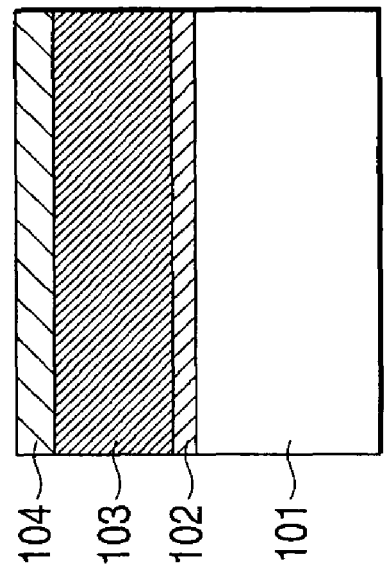

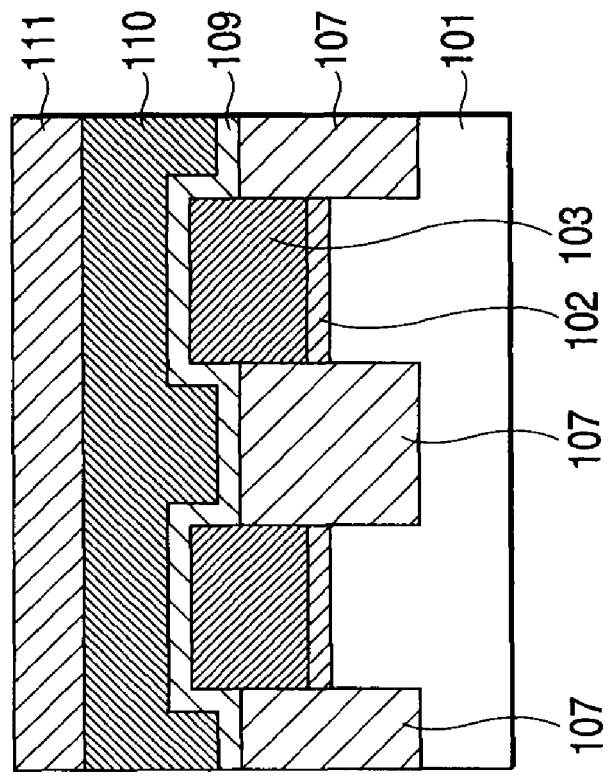
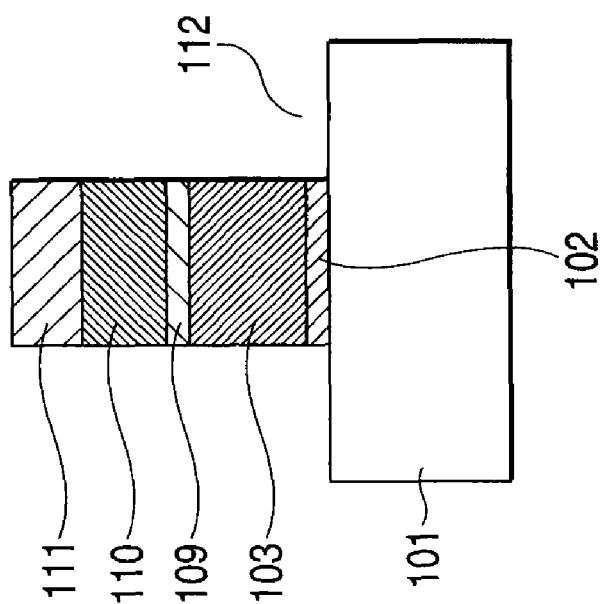

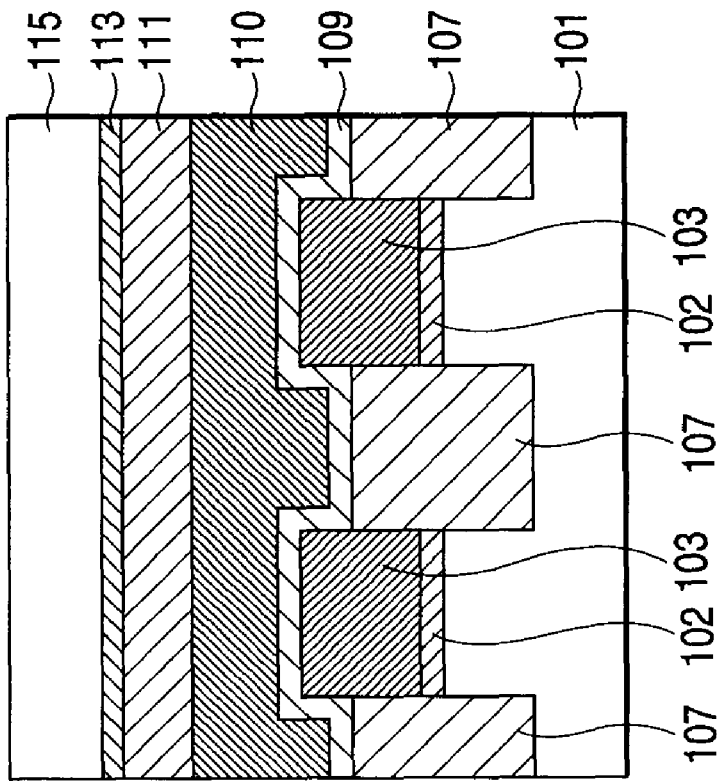
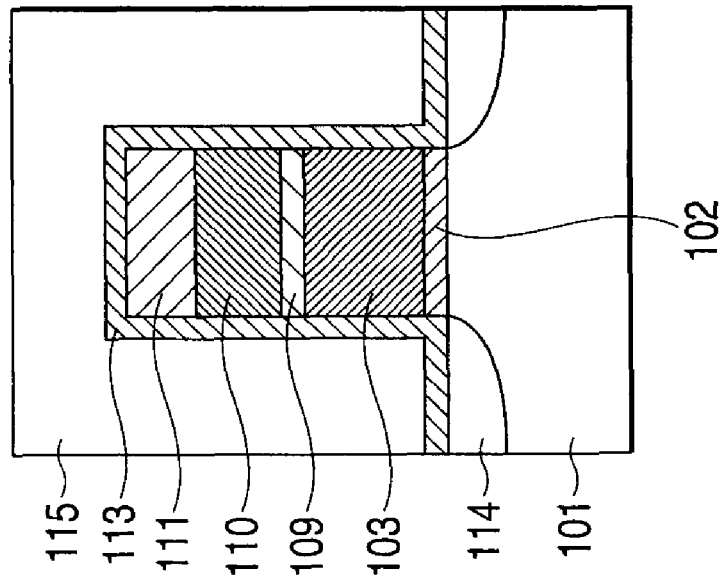

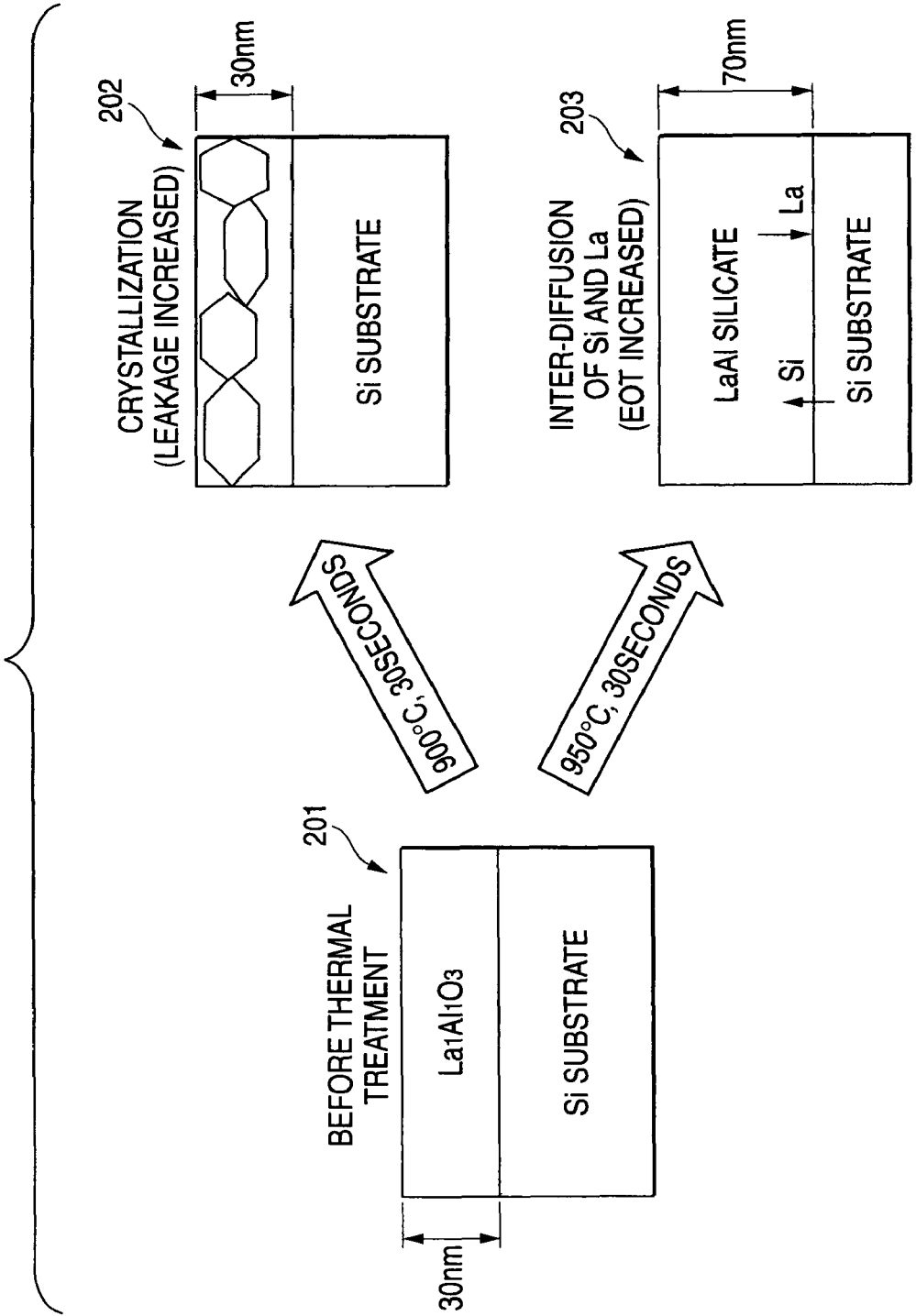

FIG. 21

| CONTROL GATE ELECTRODE (POLYCRYSTALLINE Si) |
|---|
| SiN, $Al_2O_3$ |
| $LaAlO_3$ |
| SiN, $Al_2O_3$ |
| FLOATING GATE ELECTRODE (POLYCRYSTALLINE Si) |

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2006-318627, filed on Nov. 27, 2006, the entire contents of which are incorporated herein by reference.

BACKGROUND

1. Field

The present invention relates to a nonvolatile semiconductor memory device having a stack gate structure including a floating gate electrode and a charge storage layer, and a method for manufacturing the nonvolatile semiconductor memory device.

2. Description of the Related Art

As an example of a typical nonvolatile semiconductor memory device, an NAND type flash memory having a floating gate electrode will be described.

The memory cell has a stack structure in which a tunneling insulating film and a floating gate electrode are formed on a semiconductor substrate, and furthermore, a control gate electrode is formed thereon through an inter-electrode insulating film. For a memory operation, a high electric field is applied to the control gate electrode and a shift of a threshold voltage generated by injecting electrons from a silicon substrate into the floating gate electrode is used for information storage. At this time, it is desirable that a capacitance of the inter-electrode insulating film is high to maintain a coupling ratio high enough, and also desirable that leak current is small in the inter-electrode insulating film.

A method for manufacturing a memory cell of a general NAND type nonvolatile semiconductor memory device will be described with reference to FIGS. 15A to 19B. FIGS. 15A, 16A, 17A, 18A and 19A and FIGS. 15B, 16B, 17B, 18B and 19B show cross-sections which are orthogonal to each other.

First of all, as shown in FIGS. 15A and 15B, a silicon oxide film 102 with a thickness of approximately 7 nm to 8 nm for a tunneling insulating film is formed by a thermal oxidizing method on a surface of a silicon substrate 101 doped with a desirable impurity. Next, a phosphorus doped polycrystalline silicon layer 103 with a thickness of 60 nm for a floating gate electrode and a mask material 104 for an isolation process are then deposited sequentially by a CVD (chemical vapor deposition) method. Thereafter, the mask material 104, the polycrystalline silicon layer 103 and the tunneling insulating film 102 are sequentially etched by an RIE (reactive ion etching) method using a resist mask (not shown), and furthermore, an exposed region of the silicon substrate 101 is etched to form an isolation trench 106 with a depth of 100 nm.

Next, a silicon oxide film 107 for isolation is deposited on a whole surface and the isolation trench 106 is thus filled completely, and the silicon oxide film 107 in a surface region is then removed by a CMP (chemical mechanical polishing) method to flatten a surface. At this time, the mask material 104 is exposed (FIGS. 16A and 16B).

Subsequently, the exposed mask material 104 is selectively removed, and an exposed surface of the silicon oxide film 107 is then etched with a diluted hydrofluoric acid solution and a sidewall surface 108 of the polycrystalline silicon layer 103 is exposed, and an $SiO_2/SiN/SiO_2$ film (hereinafter referred to as an ONO film) 109 having a laminated structure of a silicon oxide film and a silicon nitride film for an inter-electrode insulating film is thereafter deposited over a whole surface. An equivalent $SiO_2$ thickness of the ONO film is approximately 15 nm. At this time, the inter-electrode insulating film 109 is three-dimensionally formed on the surface of the polycrystalline silicon layer 103 and the sidewall surface 108 (FIGS. 17A and 17B). An average dielectric constant of the ONO film is as low as approximately five. For this reason, the three-dimensional inter-electrode insulating film is necessary to increase its effective capacitance by increasing the contacting area with the polysilicon layer 103.

Next, a conductive layer 110 for a control gate electrode made of a polycrystalline silicon layer with a thickness of 100 nm is sequentially deposited by a CVD method, and furthermore, an RIE mask material 111 is deposited by the CVD method. Thereafter, the mask material 111, the conductive layer 110, the inter-electrode insulating film 109, the polycrystalline silicon layer 103 and the tunneling insulating film 102 are sequentially etched by the RIE method using a resist mask (not shown), thereby slit portions 112 are formed in a direction of a word line (FIGS. 18A and 18B). Consequently, the shapes of the polycrystalline silicon layer 103 for a floating gate electrode and the conductive layer 110 for the control gate electrode are determined.

Finally, a silicon oxide film 113 for electrode sidewall is formed on an exposed surface by a thermal oxidation method, and then source and drain regions 114 are formed by using an ion implanting method. Thereafter, an interlayer insulating film 115 is formed by the CVD method in order to cover a whole surface (FIGS. 19A and 19B). Thereafter, a wiring layer is formed by a well-known method to finish a memory cell.

A high electric field is applied to the inter-electrode insulating film 109 in the memory cell of the NAND type nonvolatile semiconductor memory device during writing and erasing operations and leakage current flows therein. The leakage current impedes the charge storage, and charge erasing and writing in the floating gate electrode through the tunneling insulating film. For this reason, it is necessary to suppress the leakage current below a certain reference level which is defined from a device specification. As a result of various investigations, the leakage current level is set to be $\frac{1}{10}$ or less of the current flowing to the tunneling insulating film just before completing the writing operation. For example, under the following conditions: a thickness of the tunneling insulating film is 7.5 nm; a coupling ratio of the tunneling insulating film to the inter-electrode insulating film is 0.6; and the inter-electrode insulating film has a three-dimensional structure, an effective electric field applied to the inter-electrode insulating film (which is defined by an "(surface charge density)/(dielectric constant of $SiO_2$)") is approximately 12 to 18 MV/cm, the leakage current density in the inter-electrode insulating film must be below approximately $1 \times 10^{-2}$ A/cm$^2$.

In order to increase the storage capacity of the NAND type nonvolatile semiconductor memory devices, it is necessary to reduce a gate length and a gate width of the memory cells to mount as many cells as possible on individual chips. With a demand for miniaturization of the memory cells, a material with a higher dielectric constant (high-k) has been investigated for the inter-electrode insulating film instead of a conventional ONO film (for example, see JP-A 11-297867 (KOKAI)). The reasons are as follows.

In a generation in which a minimum processing dimension is smaller than 50 nm, distance between the memory cells becomes so small. For this reason, the inter-electrode insulating film, which is formed after forming the sidewall 108 shown in FIGS. 17A and 17B, cannot have three-dimensional structure anymore.

In a miniaturized memory cell, a so-called planar cell structure is required, in which the sidewall is not formed on the floating gate electrode and the inter-electrode insulating film is formed planarly. In the planar cell structure, a material with a higher dielectric constant than the conventional ONO film is required. This is because a use of the material with a high dielectric constant can increase capacitance even if the inter-electrode insulating film is not formed three-dimensionally, but plenary.

Furthermore, an effective electric field applied to the inter-electrode insulating film in the planar cell structure is approximately 30 MV/cm, which is two times higher than that in the three-dimensional cell structure. For the device specification, it is necessary to suppress leakage current density in the inter-electrode insulating film to be equal to or lower than $1\times10^{-2}$ A/cm$^2$ even at the high electric field region. In the ONO film, however, the leakage current is rapidly increased at a high electric field region. Therefore, it is impossible to use the ONO film as the inter-electrode insulating film of the planar cell. From this viewpoint, it is necessary to use the material with a higher dielectric constant (high-k) for the inter-electrode insulating film, instead of the ONO film. By using the high-k material, it is possible to reduce the leakage current even at the high electric field region by increasing a physical thickness with keeping a low equivalent SiO$_2$ thickness (EOT).

Examples of a promising candidate for the high-k material are rare earth oxide, rare earth nitride or rare earth oxynitride, which includes rare earth elements. These materials generally have high dielectric constants (high-k), and furthermore, have large electron barriers. Therefore, they can be used for the inter-electrode insulating film in the planar cells. However, there are inherent problems of these material system which arise in the fabrication process of a nonvolatile memory cell by the conventional manufacturing method.

As shown in FIGS. 18A and 18B and FIGS. 19A and 19B, after forming the inter-electrode insulating film, it is necessary to perform a thermal treatment for forming a control gate electrode and an electrode sidewall oxide film and a thermal treatment for activating source and drain diffused regions formed by an ion implanting method. For example, a rapid thermal treatment of approximately 30 seconds within a temperature range of 900 to 1000° C. is used for activating the source and drain diffused regions.

FIG. 20 shows changes in an LaAlO$_3$ film structure, in which rare earth oxide of LaAlO$_3$ is deposited on a silicon substrate, by rapid thermal treatment in a nitrogen atmosphere at 900° C. for 30 seconds and 950° C. for 30 seconds. These conditions correspond to thermal treatment for activating the source and drain diffused regions. As shown in a state 201 of FIG. 20, first of all, LaAlO$_3$ in 30 nm with a composition of La:Al=1:1 is deposited on the Si substrate. After rapid thermal treatment at 900° C. for 30 seconds is performed, the film thickness is not changed but crystallization occurs as shown in a state 202. For the composition of La:Al=1:1, an energetically stable perovskite structure is easily formed by the thermal treatment. In the crystallized LaAlO$_3$, current easily flows through grain boundaries. Therefore, an increase in the leakage current is observed. When the thermal treatment at 950° C. (higher temperature) for 30 seconds is performed, it is apparent that an inter-diffusion of Si and La occurs between the silicon substrate and the LaAlO$_3$, and the LaAlO$_3$ is degenerated into La silicate containing Al, and furthermore, a physical thickness rapidly increases (as shown in a state 203 in FIG. 20). This is because oxynitride including a rare earth element such as La has such a property as to be easily taken Si in. The increase in the physical thickness caused by a large amount of Si and La inter-diffusion reduces the dielectric constant. Consequently, capacitance of the inter-electrode insulating film is rapidly reduced resulting in an increase in EOT.

Due to deterioration in the inter-electrode insulating film shown in FIG. 20, a sufficient performance cannot be exhibited in writing, erasing, reading and retaining (storing) operations of a memory cell. Due to crystallization, the leakage current at 12 MV/cm is deteriorated to be equal to or more than $1\times10^{-2}$ A/cm$^2$. With the reduction in the dielectric constant due to the Si and La inter-diffusion, moreover, an electrical breakdown voltage is dropped, and the leakage current is increased. As the breakdown voltage is dropped to be approximately 20 MV/cm, the leakage current density is equal to or higher than $1\times10^{-2}$ A/cm$^2$. In both cases, the device specification of the planar cell structure cannot be satisfied.

As shown in FIG. 21, it is also possible to impose barrier layers such as SiN or Al$_2$O$_3$ below the inter-electrode insulating film in order to prevent the inter-diffusion of Si and La (for example, see L. Yan et al., Semicond. Sci. Technol. 19(2004)1-4). However, SiN and Al$_2$O$_3$ have lower dielectric constants than the oxynitride including a rare earth element. For this reason, the effective capacitance of the inter-electrode insulating film may be reduced and an improvement in a performance of a memory cell may become small. In an Al$_2$O$_3$/LaAlO$_3$ interface, where dielectric materials having different dielectric constants contact with each other, fixed charges are easily generated, resulting in a shift of a threshold voltage.

The description has been given to the problem of the crystallization which is caused when rare earth oxide, rare earth nitride or rare earth oxynitride is used for the inter-electrode insulating film or the blocking insulating film, and also the problem of the inter-diffusion of Si, which comes from a conductive material including Si or an insulating material including Si, and a rare earth element. Memory cell characteristics may be improved by solving these problems.

As described above, as the rare earth oxide, the rare earth nitride or the rare earth oxynitride which includes a rare earth element with high dielectric constants is used as the inter-electrode insulating film in the memory cell having the floating gate electrode or the blocking insulating film in the memory cell having the charge storage layer, film quality deteriorates by thermal treatment after deposition of the inter-electrode insulating film or the block insulating film due to crystallization or a reduction in the dielectric constant. From this reason, leakage current characteristics may deteriorate and a sufficient performance cannot be obtained in the writing, erasing, reading, retaining (storing) operations of the memory cells.

SUMMARY

According to a first aspect of the invention, there is provided a nonvolatile semiconductor memory device including: a semiconductor region of a first conductive type; source and drain regions of a second conductive type; a channel region formed between the source and drain regions; a tunneling insulating film formed on the channel region; a floating gate electrode formed on the tunneling insulating film; an inter-electrode insulating film formed on the floating gate electrode; and a control gate electrode formed on the inter-electrode insulating film, wherein an interface between the inter-electrode insulating film and the floating gate electrode is defined as a first interface, and an interface between the inter-electrode insulating film and the control gate electrode is defined as a second interface, wherein the inter-electrode insulating film includes one or more first elements, one or more second elements selected from Al, Ti, Zr, Hf, Ta, Mg, Ca, Sr and Ba, and oxygen, wherein the first element is selected from rare earth elements, and the second element is selected from Al, Ti, Zr, Hf, Ta, Mg, Ca, Sr and Ba, and wherein a composition ratio of the first element to the second element, which is defined as the number of atoms of the first element divided by that of the second element, is changed between the first interface and the second interface, and the composition in the vicinity of the first interface is lower than that in the vicinity of the second interface.

According to a second aspect of the invention, there is provided a method for manufacturing a nonvolatile semiconductor memory device including: forming a tunneling insulating film and a floating gate electrode layer on a semiconductor region; forming a first insulating film on the floating gate electrode layer, which includes one or more elements selected from Al, Ti, Zr, Hf, Ta, Mg, Ca, Sr and Ba, and oxygen; forming a second insulating film, which includes one or more elements selected from rare earth elements, one or more elements selected from the one or more elements included in the first insulating film, and the oxygen; forming a control gate electrode layer on the second insulating film; forming source and drain regions in the semiconductor region; and performing a thermal treatment to the first insulating film and the second insulating film to make them a single layered structure.

According to a third aspect of the invention, there is provided a nonvolatile semiconductor memory device including: a semiconductor region of a first conductive type; source and drain regions of a second conductive type; a channel region formed between the source and drain regions; a tunneling insulating film formed on the channel region; a charge storage layer formed on the tunneling insulating film; a block insulating film formed on the charge storage layer; and a control gate electrode provided on the block insulating film, wherein an interface between the block insulating layer and the charge storage layer is defined as a first interface, and an interface between the charge storage layer and the control gate electrode is defined as a second interface, wherein the block insulating film includes one or more first elements, one or more second elements, and oxygen, wherein the first element is selected from rare earth elements, and the second element is selected from Al, Ti, Zr, Hf, Ta, Mg, Ca, Sr and Ba, and wherein a composition of the first element to the second element, which is defined as the number of atoms of the first element divided by that of the second element, is changed between the first interface and the second interface, and the composition ratio in a vicinity of the first interface is lower than that in a vicinity of the second interface.

According to a fourth aspect of the invention, there is provided a method for manufacturing a nonvolatile semiconductor memory device including: forming a tunneling insulating film and a charge storage layer on a semiconductor region; forming a first insulating film on the charge storage layer, which includes one or more elements selected from Al, Ti, Zr, Hf, Ta, Mg, Ca, Sr and Ba, and oxygen; forming a second insulating film, which includes one or more elements selected from rare earth elements, one or more elements selected from the one or more elements included in the first insulating film; forming a control gate electrode layer on the second insulating film; forming source and drain regions in the semiconductor region; and performing a thermal treatment to the first insulating film and the second insulating film to make them a single layered structure.

BRIEF DESCRIPTION OF THE DRAWINGS

FIGS. 1A and 1B are cross-sectional views showing a structure of an NAND type nonvolatile memory cell according to the first embodiment;

FIGS. 2A and 2B are cross-sectional views showing a process in a method for manufacturing the NAND type nonvolatile memory cell;

FIGS. 3A and 3B are cross-sectional views showing a process in the method;

FIGS. 4A and 4B are cross-sectional views showing a process in the method;

FIGS. 10A and 10B are cross-sectional views showing a process in the method;

FIGS. 13A and 13B are cross-sectional views showing a process in the method;

FIGS. 16A and 16B are cross-sectional views showing a process in the method;

FIGS. 18A and 18B are cross-sectional views showing a process in the method;

FIGS. 19A and 19B are cross-sectional views showing a process in the method;

FIG. 20 shows the structural change in an $LaAlO_3$ film by a thermal treatment; and FIG. 21 is a cross-sectional view showing a structure of a conventional NAND type nonvolatile memory cell.

DETAILED DESCRIPTION

First Embodiment

Figure 5B:
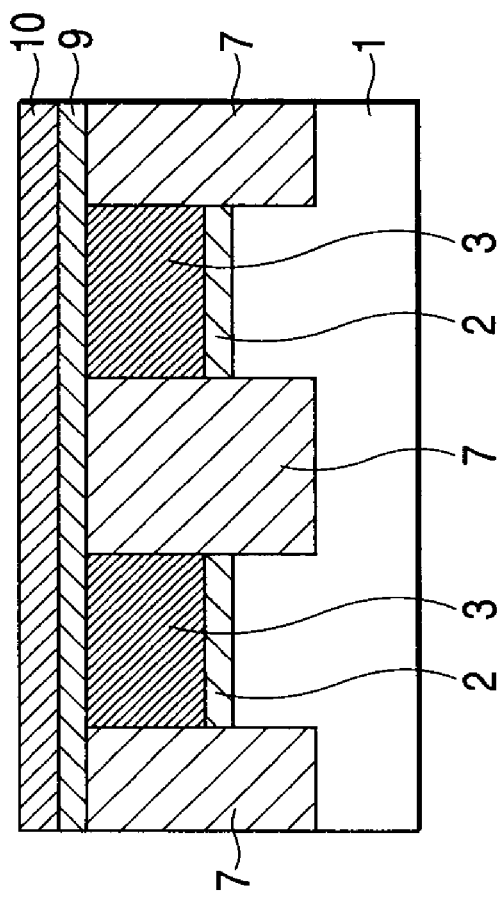
FIGS. 5A and 5B are cross-sectional views showing a process in the method.

With reference to FIGS. 1A and 1B, description will be given to a memory cell structure of an NAND type nonvolatile semiconductor memory device having a floating gate electrode in accordance with the first embodiment of the invention.

An NAND type nonvolatile semiconductor memory device contains bit lines, selective gate transistors which are connected with memory cells through the bit lines, and the memory cells which are connected in series by the bit lines and are placed under the bit lines. FIG. 1A is a cross-sectional view in a direction of a word line and FIG. 1B is a cross-sectional view in an orthogonal direction to the word line, therefore FIGS. 1A and 1B show cross-sections which are orthogonal to each other.

As shown in FIGS. 1A and 1B, source and drain regions 17 is formed in a silicon substrate 1, which is doped with a desirable impurity. A channel region (not shown) is formed between the source and drain regions 17, and a silicon oxide film 2 with a thickness of approximately 6 nm to 7 nm which acts as a tunneling insulating film is formed thereon. A phosphorous doped polycrystalline silicon layer 3, which is one of conventional conductive materials including Si, with a thickness of 40 nm as a floating gate is formed on the silicon oxide film 2. An amorphous La aluminate layer 12 as an inter-electrode insulating film is formed on the polycrystalline silicon layer 3. A conductive layer 13 as a control gate electrode, having a laminated structure of a WN layer and a W layer (in which the WN layer is positioned on the inter-electrode insulating film side) is formed on the La aluminate layer 12. A mask material 14 is formed on the conductive layer 13. (The mask material 14 can be omitted.) In the La aluminate layer 12, a composition of La/Al is set to be low in the region contacting with the floating gate electrode and to be high in the region contacting with the control gate electrode, and is set to be continuously changed (hereinafter referred to as a "compositional inclination").

A topmost surface and a side surface of the stacked structure are covered with a silicon oxide film 16 which is referred to as an electrode sidewall oxide film, and furthermore, an interlayer insulating film 18 is formed to cover a whole surface. The channel regions, the tunneling insulating films (the silicon oxide films 2) and the floating gate electrodes (the polycrystalline silicon layers 3) of the adjacent memory cells are isolated by an isolation region 7 of the silicon oxide film. In the memorycells arrangedin a direction of abit line, the inter-electrode insulating film (the La aluminate layer 12) and the control gate electrode (the conductive layer 13) are common and are extended over the isolation region 7.

With reference to FIGS. 2A to 6B and FIGS. 1A and 1B, next, description will be given to a method for manufacturing the memory cell of the NAND type nonvolatile semiconductor memory device shown in FIGS. 1A and 1B according to the first embodiment.

First of all, a silicon oxide film 2 with a thickness of approximately 6 nm to 7 nm for a tunneling insulating film is formed by a thermal oxidation method on a surface of a silicon substrate 1 doped with a desirable impurity. Next, a phosphorus doped polycrystalline silicon layer 3, which is one of conductive materials including Si, with a thickness of 40 nm for a floating gate electrode and a mask material 4 for isolation are deposited sequentially by a CVD method. Thereafter, the mask material 4, the polycrystalline silicon layer 3 and the silicon oxide film 2 are sequentially etched by an RIE method using a resist mask (not shown). Thereafter, an exposed region of the silicon substrate 1 is etched to form an isolation trench 6 with a depth of 60 nm (FIGS. 2A and 2B).

Subsequently, a silicon oxide film 7 for an isolation region is deposited on a whole surface and the isolation trench 6 is thus filled completely, and the silicon oxide film 7 in a surface portion is then removed by a CMP method to flatten the surface. At this time, the mask material 4 is exposed (FIGS. 3A and 3B). A material to be used for the isolation region is not restricted to the silicon oxide film but is preferably an insulating material including silicon and oxygen, and may be a silicon oxynitride film, for example.

Subsequently, the exposed mask material 4 is selectively removed, and an exposed surface of the silicon oxide film 7 is then etched with a diluted hydrofluoric acid solution so as to flatten surfaces of the silicon oxide film 7 and the polycrystalline silicon layer 3.

Figure 17B:
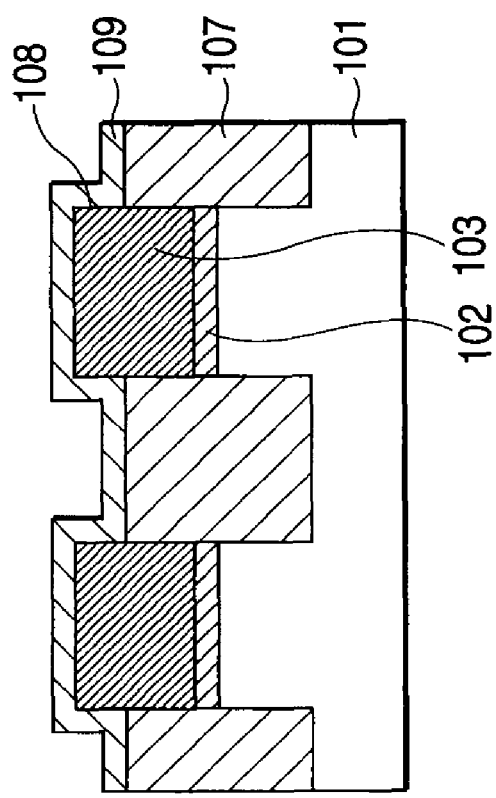
FIGS. 17A and 17B are cross-sectional views showing a process in the method.
Figure 17A:
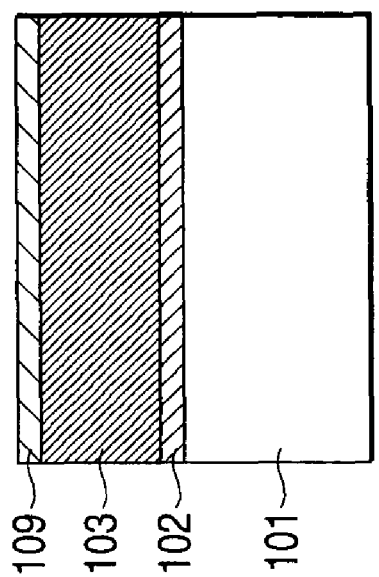

The inter-electrode insulating film is formed on the surface and the sidewall of the floating gate electrode in the related-art manufacturing method shown in FIGS. 17A and 17B. Since it is possible to sufficiently increase the dielectric constant of the inter-electrode insulating film in this embodiment, it is not necessary to form the inter-electrode insulating film on the sidewall of the floating gate electrode. Preferably, a flat surface is formed.

Figure 5A:
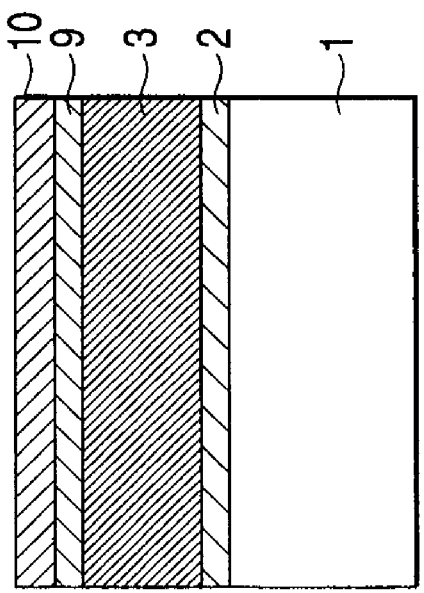

After the flat surface is formed, an alumina layer 9 with a thickness of 3 nm is deposited on the whole surface by a molecular beam epitaxy (MBE) method using Al and oxygen gas as sources, at a substrate temperature of 650° C., with an oxygen partial pressure of $5 \times 10^{-6}$ Torr (FIGS. 4A and 4B). Subsequently, a La aluminate layer 10 with a thickness of 22 nm using Al, La and oxygen as sources is deposited at a substrate temperature of 650° C. with an oxygen partial pressure of $5 \times 10^{-6}$ Torr (FIGS. 5A and 5B). At this time, it is confirmed that the alumina layer 9 and the La aluminate layer 10 are amorphous by a reflecting high energy electron diffraction method (RHEED) A composition of alumina in which Al and oxygen are completely bonded is $Al_2O_3$. However, the alumina which is formed under the low oxygen pressure as described above have low oxygen composition such as $Al_2O_{2.8}$ i.e., Al rich and the oxygen poor. Moreover, the La aluminate with high Al composition, $La_{0.9}Al_{1.1}O_3$, is formed by supplying higher amount Al compared with La amount. As the alumina and the La aluminate are deposited by the MBE method in this embodiment, it is possible to use other methods such as a sputtering method, a CVD method and a laser abrasion method.

Figure 6A:
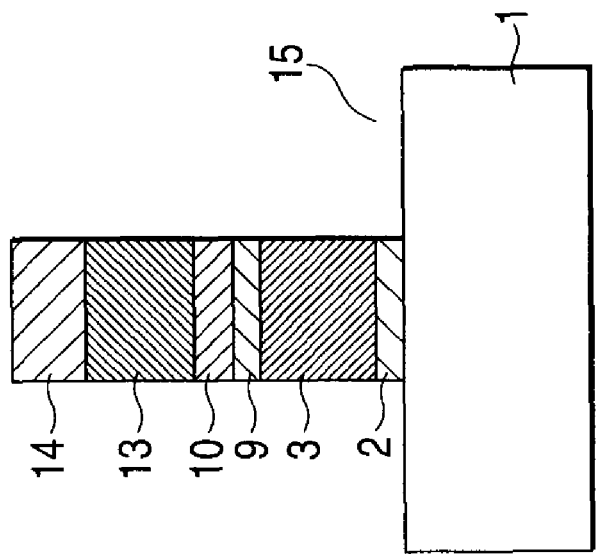
FIGS. 6A and 6B are cross-sectional views showing a process in the method.
Figure 6B:
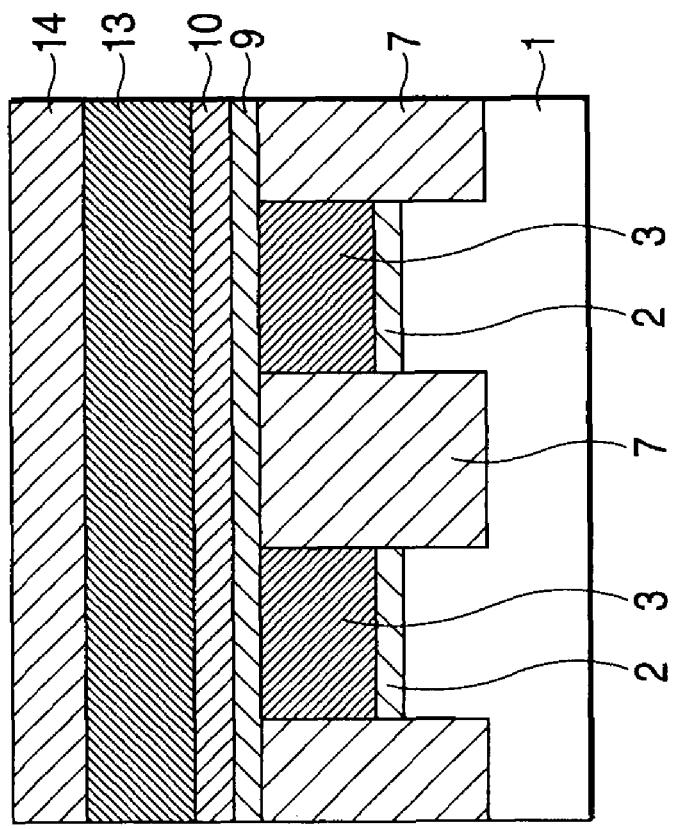

Next, a conductive layer 13 with a thickness of 100 nm, which has a two-layer structure including a WN layer and a W layer, for a control gate electrode is sequentially deposited. Thereafter, a mask material 14 for RIE is deposited by a CVD method. Then, the mask material 14, the conductive layer 13, the La aluminate layer 10, the alumina layer 9, the polycrystalline silicon layer 3 and the tunneling insulating film 2 are sequentially etched by the RIE method using a resist mask (not shown) so that slit portions 15 in a direction of a word line are formed. Consequently, shapes of the La aluminate layer 10, the alumina layer 9, the polycrystalline silicon layer 3 and the conductive layer 13 are determined as shown in FIGS. 6A and 6B.

As shown in FIGS. 1A and 1B, finally, the silicon oxide film 16, which is referred to as an electrode sidewall oxide film, is formed on the exposed surface by the thermal oxidation method, and the source and drain regions 17 are then formed by using an ion implanting method for the silicon substrate 1. After the ion implantation, an activating thermal treatment is performed at 950° C. for 30 seconds in a nitrogen atmosphere. By the thermal treatment, the La aluminate layer 10 and the alumina layer 9 are changed into the single layer of the La aluminate with the compositional inclination, which is referred as the inter-electrode insulating film 12. The details will be described below. Furthermore, the interlayer insulating film 18 is formed by the CVD method in order to cover the whole surface. Thereafter, a wiring layer is formed by a well-known method so that the nonvolatile memory shown in FIGS. 1A and 1B is finished.

Figure 7A:
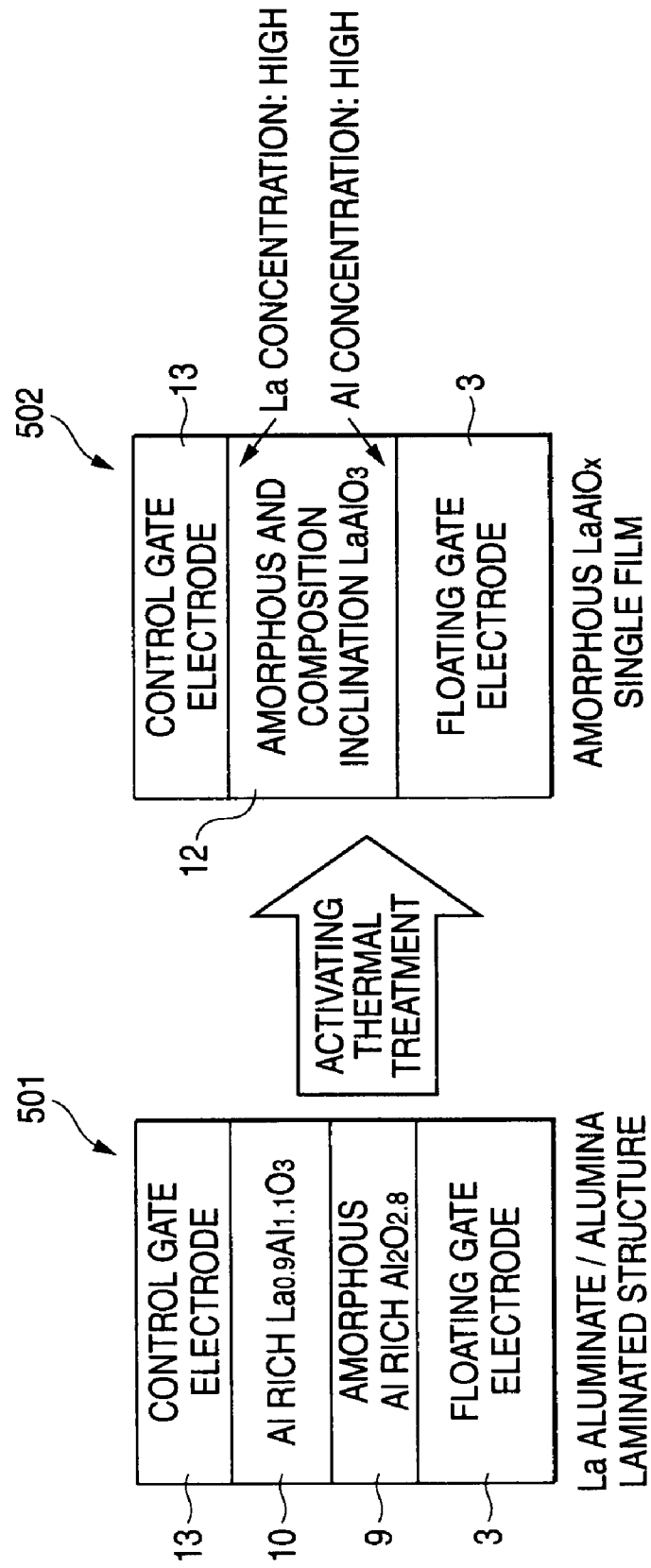
FIG. 7A shows the structural change of a La aluminate film by thermal treatment.
Figure 7B:
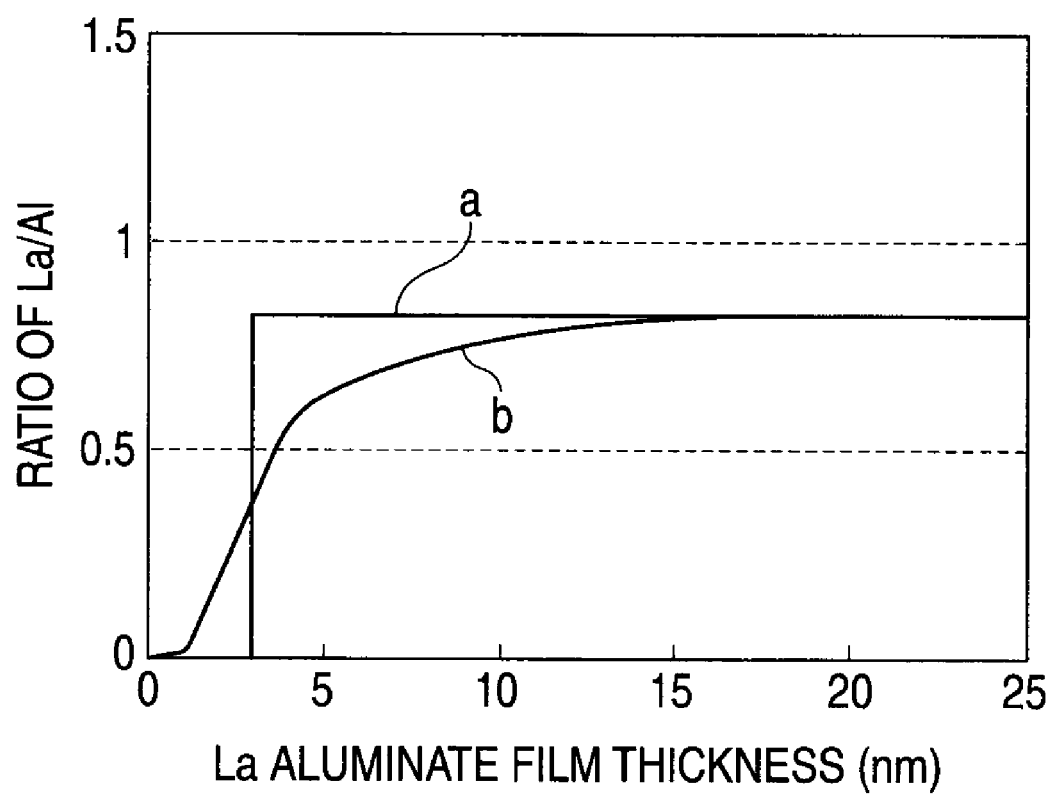
FIG. 7B shows the compositional profile in the La aluminate film.

FIG. 7A schematically shows a structural change of the La aluminate layer 10 and the alumina layer 9 into the single layer of the La aluminate inter-electrode insulating film 12 with the compositional inclination. The composition of the alumina layer 9 is $Al_2O_{2.8}$, in which Al is rich and the oxygen is poor, compared with the stoichiometric composition of $Al_2O_3$. Therefore, the bonding strength of Al and oxygen is weak and Al is easily diffused into the La aluminate layer 10 so that the single layer of the La aluminate layer 12 is formed. FIG. 7B shows the compositional profile in the La aluminate layer. The film thickness of 0 nm indicates the interface contacting with the floating gate electrode and the film thickness of 25 nm indicates the interface contacting with the control electrode. Before the thermal treatment, i.e., in the structure 501 shown in FIG. 7A, an alumina layer (the composition of La/Al is zero) and an $La_{0.9}Al_{1.1}O_3$ layer (the composition of La/Al is 0.9/1.1=0.82) are laminated. Therefore, the composition of La/Al changes like a step shape as shown in FIG. 7B with the line "a". After the thermal treatment, i.e., in the structure 502 shown in FIG. 7A, Al is diffused from the alumina layer to the La aluminate layer so that the composition of La/Al continuously changes as shown in the line "b". Although the composition of La/Al is zero at the film thickness of 0 nm (the interface contacting with the floating gate electrode), it is gradually increased and then saturated at La/Al=0.82, which is the composition of La/Al in the $La_{0.9}Al_{1.1}O_3$ layer. An average composition ((the total number of La atoms)/(the total number of Al atoms)) in the whole film is equal to 0.62, indicating Al rich.

The inventors have found that the La aluminate having the compositional inclination can be formed by laminating an amorphous alumina layer with weak bonding-strength of Al and oxygen, and an La aluminate layer having an La/Al composition shifted from one by performing a high temperature thermal treatment to the laminated layers, for the first time. Furthermore, it has been apparent that the related-art problems are solved in the La aluminate film having the compositional inclination. First of all, if in $La_1Al_1O_3$ having a composition of La/Al=1, an energetically stable perovskite structure is formed, the $La_1Al_1O_3$ phase is changed from amorphous into polycrystalline by the thermal treatment, resulting in increase in leakage current. However, it has been confirmed that the perovskite structure is hardly formed in the film with the average composition of La/Al shifted from one, and that crystallization does not occur even by performing the high temperature thermal treatment. As shown in FIG. 7B, La is not present at the interface contacting with the floating gate electrode made by polycrystalline Si. Consequently, it can avoid to contact of Si and La directly, resulting in the suppression in inter-diffusion of Si and La. Thus, it can prevent an increase in a physical thickness by a thermal treatment. While the composition of La/Al at the interface contacting with the floating gate electrode is set to be zero in the embodiment, it does not need to be zero. It has been experimentally confirmed that the composition of La/Al at the interface contacting with the floating gate electrode is desirably lower than 0.1 in order to prevent inter-diffusion of Si and La by reducing the possibility of La and Si contact, in the case of a conductive material including Si is used for the floating gate electrode. Furthermore, in the laminated structure, fixed charges generated at the interface between the alumina layer and the La aluminate layer cause a flat band voltage shift. However, it has also been confirmed that the fixed charges can be reduced by employing the single layer of La aluminate having a compositional inclination. In order to control a threshold voltage of the memory cells, it is important to eliminate a flat band shift caused by the fixed charges.

Method for fabricating the compositional inclination La aluminate layer is not limited to the method of the embodiment described above. For example, a technique for alternately depositing $Al_2O_3$ and $La_2O_3$ can be used through an atomic layer control vapor phase method (an ALD method) or an MBE method. In this case, the compositional inclination can be made by increasing the number of cycles of an $Al_2O_3$ film on the side close to the floating gate electrode, and increasing the number of cycles of an $La_2O_3$ film on the side close to the control gate electrode. Although the La aluminate film, equivalent characteristics with this embodiment can be obtained by this technique such as the ALD method, the film forming procedure is complicated and increase in a cost cannot be avoided. In the manufacturing method according to the embodiment, it is possible to implement a nonvolatile semiconductor memory having excellent cell characteristics while reducing a cost by the simple method.

Figure 8A:
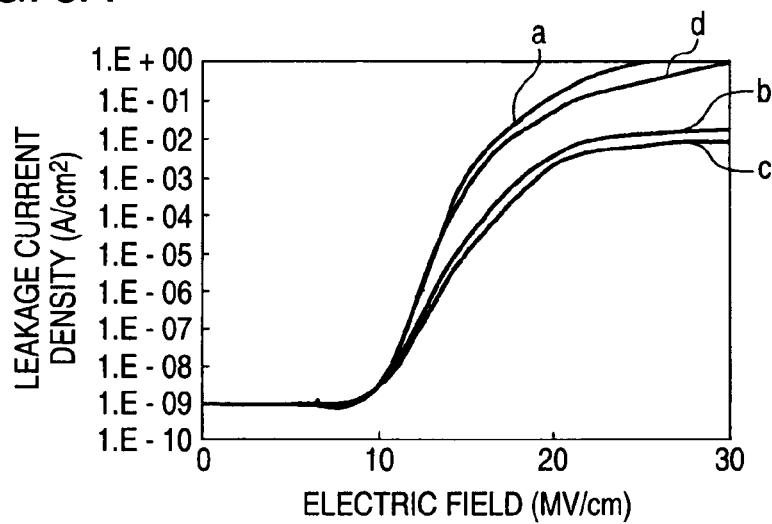
FIGS. 8A and 8B show the electrical characteristics of the La aluminate film.
Figure 8B:
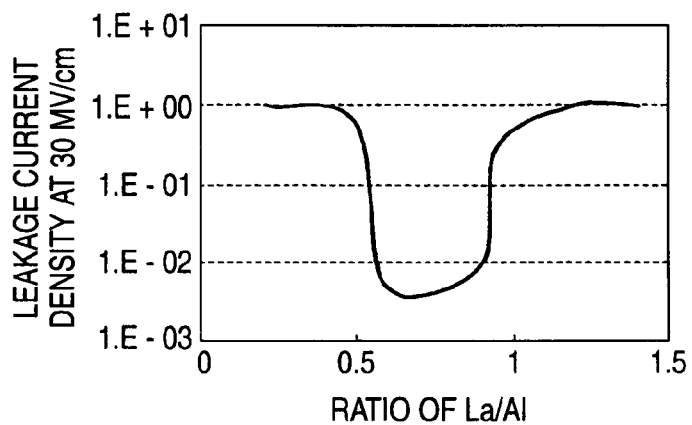

Next, there was examined relationships between electric field and leakage current density by varying the average composition of La/Al in the La aluminate film having the compositional inclination. As shown in FIG. 8A, the leakage current is large when La/Al is equal to 1.2 (the line "a"), and the leakage characteristic is greatly improved when the La/Al ratio is reduced to be 0.9 (the line "b"). It is apparent that the leakage characteristic is excellent with La/Al=0.6 (the line "c"), however, the leakage is increased when La/Al is reduced to 0.5 (a line "d"). FIG. 8B shows the dependence of leakage current density at electric field of 30 MV/cm, at which writing and erasing operations on the memory cell are performed, on the average composition of La/Al. It is apparent that it is necessary to set the average composition ratio of La/Al to be 0.6 to 0.9 in order to reduce the leakage current density to be equal to or lower than the device specification ($<1\times10^{-2}$ $A/cm^2$). Since the property of the La aluminate with the average La/Al composition of about 0.5 is similar to that of $Al_2O_3$ having a low dielectric constant, the leakage characteristic is deteriorated. On the other hand, the leakage current density is increased for the La aluminate with the average La/Al composition higher than 0.9, in which a large amount of La is contained. It is due to the influence of moisture absorbing property of rare earth elements. In other words, it is important that an average composition of a rare earth element(s) in rare earth oxynitride to one or more elements selected from Al, Ti, Zr, Hf, Ta, Mg, Ca, Sr and Ba is lower than one in order to reduce the leakage current density. Furthermore, it has been found that the range of the average La/Al composition is properly set to be 0.6 to 0.9 (the average La/Al composition=(the total number of atoms of one or more elements selected from rare earth elements)/(the total number of atoms of one or more elements selected from Al, Ti, Zr, Hf, Ta, Mg, Ca, Sr and Ba).

The La aluminate film formed by the method described above in detail with the compositional inclination, amorphous phase and La/Al=0.62 has EOT of 4 nm with a physical thickness of 25 nm and a dielectric constant of 25. It has been confirmed that the dielectric constant is almost equal to that of $LaAlO_3$ having La/Al=1, if the average composition of La/Al ranges from 0.6 to 0.9.

It has been confirmed that a coupling ratio of the memory cell according to the embodiment is a high value of 0.6 or greater and sufficient performance can be obtained in the writing, erasing, reading, and retaining (storing) operations of the memory cell. The breakdown voltage of the inter-electrode insulating film is high, that is, 35 MV/cm or higher and the leakage current density at 30 MV/cm is $5\times10^{-3}$ $A/cm^2$, and the device specifications can be fully satisfied.

On the other hand, when the $LaAlO_3$ with La/Al=1 which has no compositional inclination is formed as the inter-electrode insulating film as in the related art, a large amount of Si diffuses from polycrystalline silicon of the floating gate electrode by thermal treatment (an impurity activation after an ion implantation) so that the LaAlO$_3$ is changed to La silicate. At this time, the physical thickness is increased to be equal to or greater than 30 nm, and furthermore, the dielectric constant is reduced to be 12 and the equivalent SiO$_2$ thickness is increased to be 10 nm. The coupling ratio is considerably reduced by the reduction in the capacitance of the inter-electrode insulating film, and the characteristics of the writing, erasing, reading, and retaining (storing) operations of the memory cell is greatly deteriorated. Furthermore, the electrical breakdown voltage is reduced to be approximately 25 MV/cm, and furthermore, the leakage current density is increased to be 5×10$^{-2}$ A/cm$^2$, so that the device specifications cannot be satisfied.

(First Modification)

As explained in the first embodiment, the conductive material including Si such as the polycrystalline silicon (typically, n$^+$ type polycrystalline silicon) is often used for the floating gate electrode. The conductive material including Si represents a material mainly containing Si semiconductor, and furthermore, dopant impurities. A semiconductor host material including SiGe obtained by adding Ge to Si can be used as well as Si. There is a great advantage that a high reliability of the tunneling insulating film can be maintained if the material directly contacting with the tunneling insulating film is made of the conductive material including Si. On the other hand, conductive materials including metal usually have greater work function than the conductive material including Si, so that they are used in a region of the floating gate electrode contacting with an inter-electrode insulating film in order to reduce leakage current density from the floating gate electrode to the inter-electrode insulating film in some cases. For example, it is possible to use WN and TiN. In this case, the region of the floating gate electrode contacting with the inter-electrode insulating film does not contain Si. Therefore, the composition of La/Al does not need to be lower than 0.1 in the region contacting with the floating gate electrode. Even if the ratio of La/Al is approximately 0.2 to 0.3 as shown in the line "a" in FIG. 8C, there is no problem. However, in order to avoid the problem of crystallization, it is essential to introduce the compositional inclination into the La aluminate layer. Moreover, it is also possible to employ the structure (not shown) in which an insulating film including Si is further interposed between the floating gate electrode and the inter-electrode insulating film. The insulating film including Si enables to suppress oxidation of the interface between the inter-electrode insulating film and the floating gate at a subsequent heating process. In this case, it is desirable that the ratio of La/Al in the region contacting with the insulating film including Si is set to be lower than 0.1. It is possible to implement a method for manufacturing the insulating film including Si, such as the direct nitriding of Si in an NH$_3$ gas atmosphere or through an N$_2$ plasma, or an SiN depositing method using ALD-CVD over the floating gate.

In the embodiment, a conductive material including metal formed laminately with a WN layer and W layer (the WN layer is positioned on the inter-electrode insulating film side) is used as a control gate electrode material. This is intended for reducing the leakage current flowing from the inter-electrode insulating film to the control gate electrode and to decrease EOT by using a conductive material with a large work function. In case of using WN (about 4.8 eV), which has a larger work function than that of TaN (about 4.0 eV), the leakage current can be reduced. As compared with the conventional control gate electrode formed with polycrystalline Si, it is possible to avoid a formation of depletion layer and to reduce EOT by approximately 1 nm by using the conductive material including metal. This is important for maintaining a high coupling ratio. For the other examples of conductive materials including metal, it is possible to use conductive materials with large work functions, such as metal nitride and metal oxide. By using a conductive material which includes metal, but does not include Si for the control gate electrode, furthermore, it is possible to increase the composition of La/Al in the region of the inter-electrode insulating film contacting with the control gate electrode. Therefore, a dielectric constant can be maintained to be higher and EOT can further be reduced.

(Second Modification)

Figure 8C:
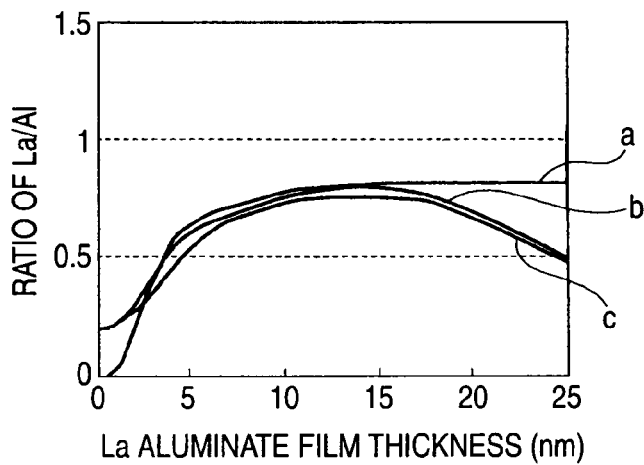
FIG. 8C shows the compositional profile in the La aluminate film.

In case where a conductive material including metal whose work function is larger than that of a conductive material including Si is used in a region of a floating gate electrode contacting with an inter-electrode insulating film, and also in case where a conductive material including Si and metal such as metal silicide is used for a control gate, it is desirable that a composition of La/Al in a region contacting with a control gate electrode is reduced to be approximately 0.5 or less as shown in the line "b" of FIG. 8C. In order to form the metal silicide, polycrystalline Si is first deposited on the inter-electrode insulating film and metal is then deposited thereon, and a thermal treatment at approximately 400 to 600° C. is performed for the reaction of Si and metal, resulting in the formation of the metal silicide. In the thermal treatment at such a low temperature, the diffusion rate of Si into the inter-electrode insulating film is very low. It has been experimentally confirmed that the composition of La/Al of the inter-electrode insulating film in the region contacting with the control gate electrode is desirably set to be equal to or lower than 0.5 in order to minimize the diffusion of Si. It has also been confirmed that the diffusion of Si from the metal silicide to La aluminate is not caused by a subsequent thermal treatment at a high temperature because the bonding state of the metal silicide is stable even at a high temperature. More specifically, it is possible to use silicide including W, Mo, Co or Ni for the metal silicide. Moreover, it is also possible to use a laminated structure of the control gate electrode in which an Si conductive material is formed on the metal silicide. When a conductive material including Si such as polycrystalline silicon (typically, n$^+$ type polycrystalline silicon) is used for the floating gate electrode, it is desirable that the composition of La/Al in a region contacting with the floating gate electrode is set to be lower than 0.1 and the composition of La/Al in the region contacting with the control gate electrode is reduced to be equal to or lower than 0.5 as shown in the line "c" of FIG. 8C. It is possible to implement a manufacturing method by using a laminated structure such as a three-layer structure of Al$_2$O$_{2.8}$ (Al rich alumina)/La aluminate/Al$_2$O$_{2.8}$ (Al rich alumina), with performing a high temperature thermal treatment. In addition, it is also possible to employ a structure (not shown) in which an insulating film including Si is further interposed between the floating gate electrode and the inter-electrode insulating film. It is possible to suppress an oxidation of an interface between the inter-electrode insulating film and the floating gate at a subsequent heating process by interposing the insulating film including Si. In this case, it is desirable that the composition of La/Al in the region contacting with the insulating film including Si is set to be lower than 0.1 and the composition of La/Al in the region contacting with the control gate electrode is reduced to be approximately 0.5 or less. It is possible to implement a method for manufacturing the insulating film including Si by direct nitriding of Si in an NH$_3$ gas atmosphere or through an N$_2$ plasma, or an SiN deposition using ALD-CVD over the floating gate.

In the embodiment, an isolation region includes a silicon oxide film. However, an insulating material including Si may be used for the isolation region, and it is not limited to a silicon oxide film or SiON. In addition, metal nitride having an insulating property can also be used as an insulating material of the isolation region. Furthermore, it is also possible to use an insulating material including Ge, in addition to Si.

While the La aluminate is used as the inter-electrode insulating film in the embodiment, it is also possible to use rare earth oxide or rare earth oxynitride, which contains one or more rare earth elements, and one or more elements selected from Al, Ti, Zr, Hf, Ta, Mg, Ca, Sr and Ba, which are added in order to stabilize a bonding state of the rare earth element for suppressing a moisture absorbing property. The rare earth elements contain seventeen elements, that is, La, Ce, Pr, Nd, Pm, Sm, Eu, Gd, Tb, Dy, Ho, Er, Tm, Yb, Lu, Sc and Y. Examples of a material which can be used rare earth oxide including two elements such as $BaCeO_x$, $BaPrO_x$, $CaCeO_x$, $EuTiO_x$, $MgCeO_x$, $SrCeO_x$, $CeAlO_x$, $DyAlO_x$, $EuAlO_x$, $GdAlO_x$, $LaTiO_x$, $NdAlO_x$, $PrAlO_x$, $SmAlO_x$, $YAlO_x$, $CeTaO_x$, $DyTaO_x$, $GdTaO_x$, $LaTaO_x$, $NdTaO_x$, $PrTaO_x$, $YTaO_x$, $YbTaO_x$, $LaTaO_x$, $LaHfO_x$, and $LaZrO_x$, and rare earth oxynitride obtained by adding nitrogen to these materials. Moreover, it is also possible to use rare earth oxide such as $BaDyWO_x$, $BaLaWO_x$, $BaErTaO_x$, $CaLaTaO_x$, $SrGdTaO_x$, and $LaMgTiO_x$, which contain at least two elements and rare earth oxynitride obtained by adding nitrogen to these materials. It is also possible to use rare earth oxide and rare earth oxynitride which contain more elements. It can be supposed that the materials which have a dielectric constant of 15 to 30 is desirable for the inter-electrode insulating film. If the dielectric constant is excessively low, the effect of reducing the leakage current cannot be obtained. To the contrary, if the dielectric constant is excessively high, interference between memory cells is caused. In order to enhance the effect of reducing the leakage current, furthermore, it is desirable that barrier height for electrons should be large.

Second Embodiment

With reference to FIGS. 9A to 14B, an MONOS (metal-oxide-nitride-oxide-semiconductor) structure according to the second embodiment of the invention will be described. In order to obtain a large storage capacity also in the MONOS structure, a planar cell structure having each cell isolated by a silicon oxide film is used so as to prevent interference between the adjacent memory cells.

Figure 9A:
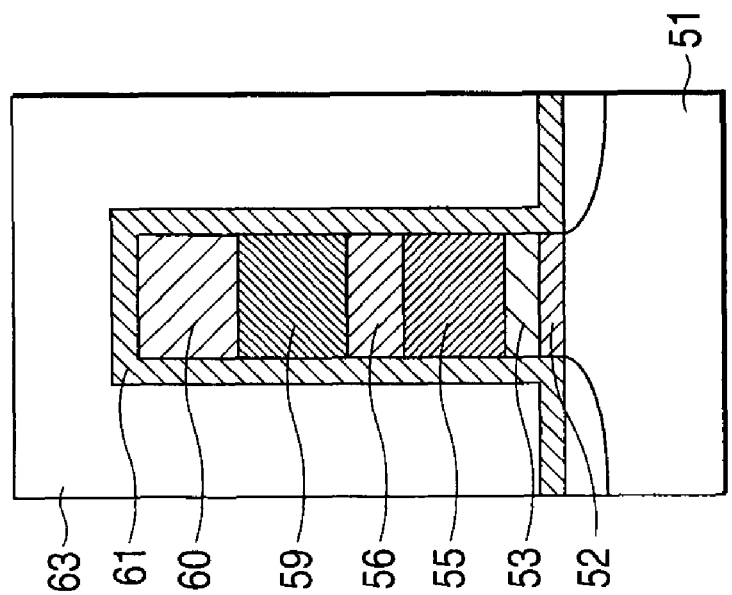
FIGS. 9A and 9B are cross-sectional views showing a process in a method for manufacturing an NAND type nonvolatile memory cell according to the second embodiment.
Figure 9B:
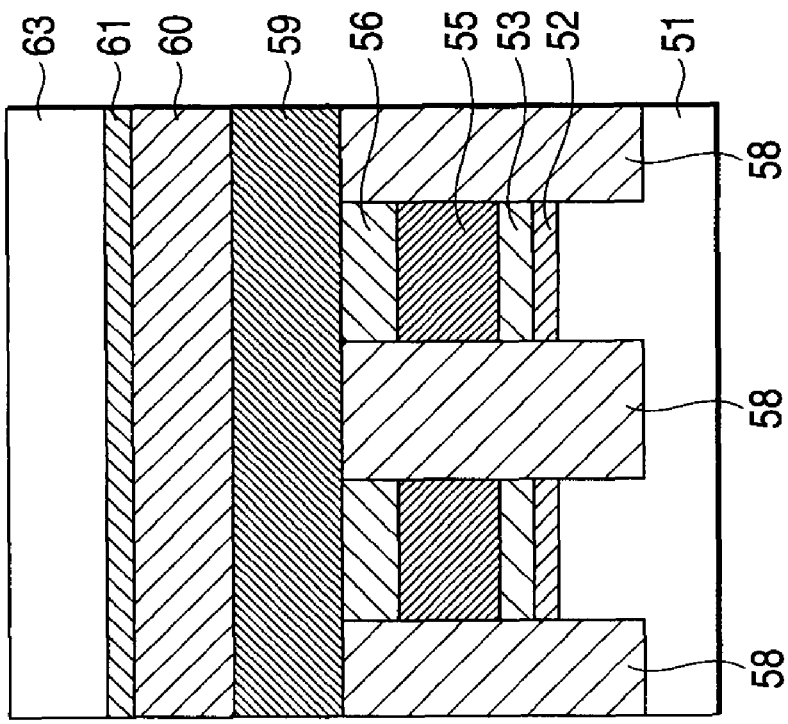

FIGS. 9A and 9B shows an example of a cell structure of an NAND type MONOS flash memory as a reference example. In FIGS. 9A and 9B, a row direction is set to be a direction in which a word line (a control gate electrode) is extended, and a column direction is set to be an orthogonal direction to the row direction. First of all, as shown in FIGS. 10A and 10B, a tunneling oxide film 52 with a thickness of approximately 3 to 4 nm by a thermal oxidation method is formed on a silicon substrate 51 (containing a well region) doped with a p-type impurity. Next, a silicon nitride film (a charge storage layer) 53 with a thickness of approximately 4 nm is formed on the tunneling oxide film 52 by a CVD (chemical vapor deposition) method.

By using an MBE method, next, in which Sr is used as a source, a Sr oxide layer 54 with a thickness of 5 nm is formed at a substrate temperature of 650° C. with an oxygen partial pressure of $5\times10^{-6}$ Torr. Subsequently, by using Sr and Ce as sources, a SrCe oxide layer 55 with a thickness of 15 nm is formed at the substrate temperature of 650° C. with an oxygen partial pressure of $5\times10^{-6}$ Torr. At this time, it is confirmed that the Sr oxide layer 54 and the SrCe oxide layer 55 are amorphous by a reflecting high energy electron diffraction method (RHEED). A composition of Sr oxide in which Sr and oxygen are bonded completely is $SrO_2$. However, the Sr oxide layer 54 is formed in a condition of a low oxygen supply resulting in $Sr_1O_{1.8}$ (Sr-rich and oxygen-poor state). Moreover, the SrCe oxide is set to be $Sr_{1.05}Ce_{0.95}O_3$ (Sr-rich state) by setting Sr supply higher than that of Ce. Although the Sr oxide and the SrCe oxide are deposited by the MBE method, it is possible to use other methods such as a sputtering method, a CVD method and a laser abrasion method.

A TiN (titanium nitride) film (a control gate electrode) 56 with a thickness of 100 nm and a mask material 57 for processing an isolation region are sequentially formed thereon. A photoresist mask is formed on the mask material 57 and is thus exposed and developed. By a RIE (reactive ion etching) method, then, a pattern of the photoresist mask is transferred onto the mask material 57. Thereafter, the photoresist mask is removed. The mask material 57 is used as a mask to sequentially etch the WN film 56, the silicon nitride film 53 and the tunneling oxide film 52 by the RIE method. Thus, a slit 55a for isolating adjacent memory cells in a row direction is formed. Subsequently, the silicon substrate 51 is etched by the RIE method to form an isolation trench 55b with a depth of approximately 100 nm (FIGS. 10A and 10B).

Figure 11B:
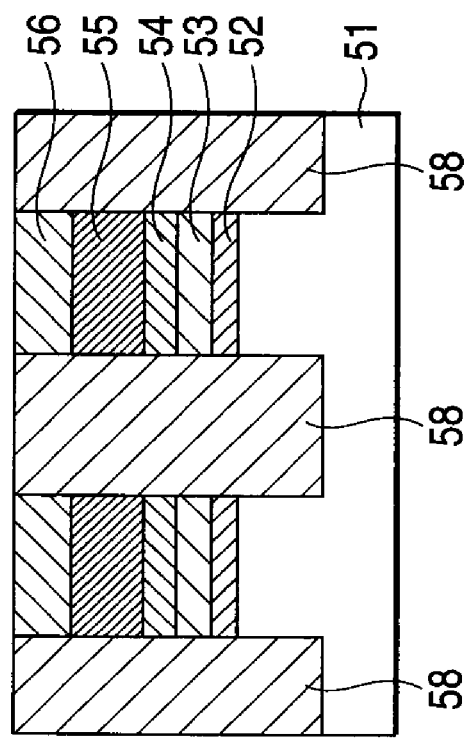
FIGS. 11A and 11B are cross-sectional views showing a process in the method.
Figure 11A:
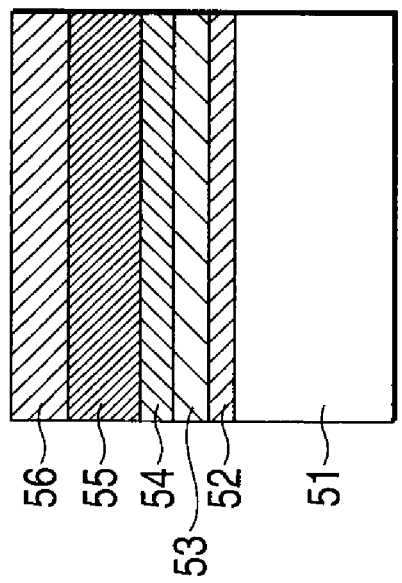

Next, a silicon oxide film (an embedded oxide film) 58 for completely filling the slit 55a and the isolation trench 55b is formed by a CVD method. Then, the silicon oxide film 58 is polished until the mask material 57 is exposed by a CMP (chemical mechanical polishing) method and a surface of the silicon oxide film 58 is thus flattened. Thereafter, the mask material 57 is selectively removed. As shown in FIGS. 11A and 11B, subsequently, a diluted hydrofluoric acid solution is used to etch back the silicon oxide film 58 so that a height of the silicon oxide film 58 is coincident with that of the TiN film 56.

Figure 12A:
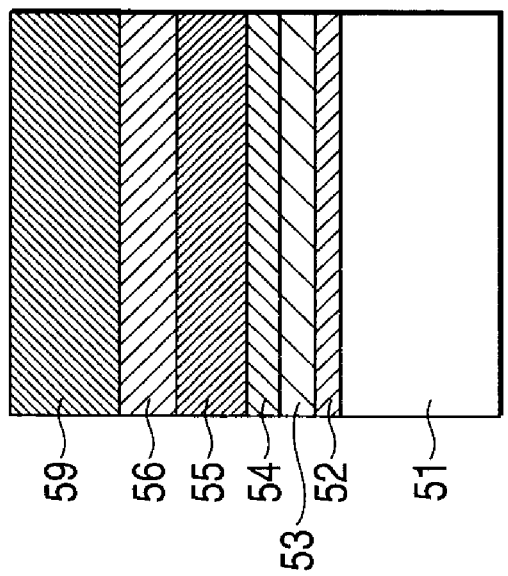
FIGS. 12A and 12B are cross-sectional views showing a process in the method.
Figure 12B:
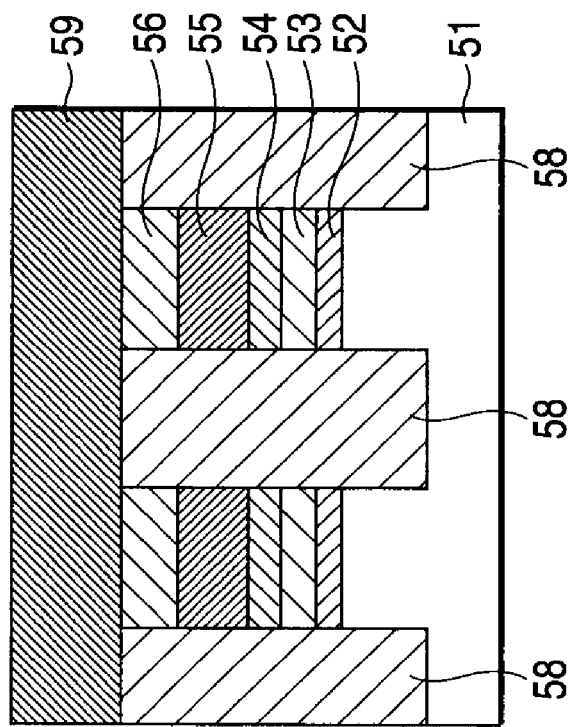

As shown in FIGS. 12A and 12B, then, a conductive film (a word line) 59 made of tungsten with a thickness of approximately 100 nm is formed on the TiN film (the control gate electrode) 56 by the CVD method, for example. Subsequently, a mask material 60 is formed on the conductive film 59 by the CVD method. Thereafter, a photoresist mask is formed on the mask material 60 and is thus exposed and developed. Next, a pattern of the photoresist mask is transferred onto the mask material 60 by the RIE method. Then, the photoresist mask is removed.

As shown in FIGS. 13A and 13B, thereafter, the conductive film 59, the TiN film 56, the SrCe oxide layer 55, the Sr oxide layer 54, the silicon nitride film 53 and the tunneling oxide film 52 are sequentially etched by the RIE method and by using the mask material 60 in order to form a shape of an MONOS gate stack.

Figure 14A:
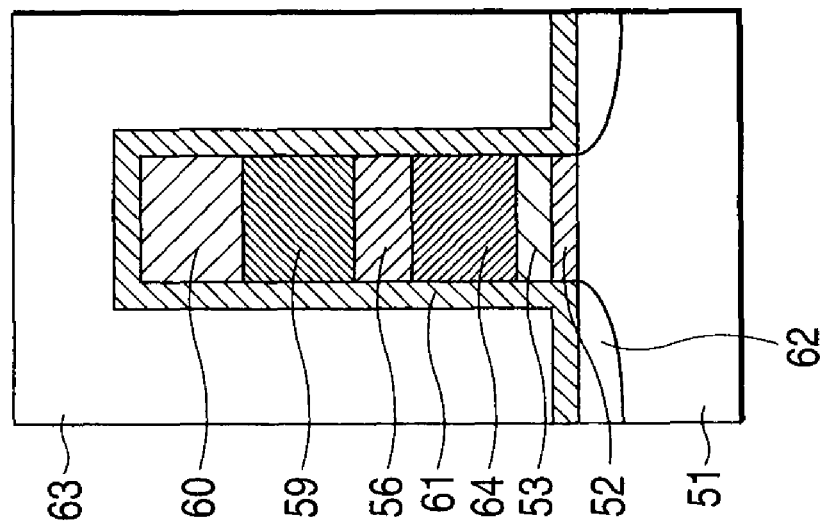
FIGS. 14A and 14B are cross-sectional views showing a process in the method.
Figure 14B:
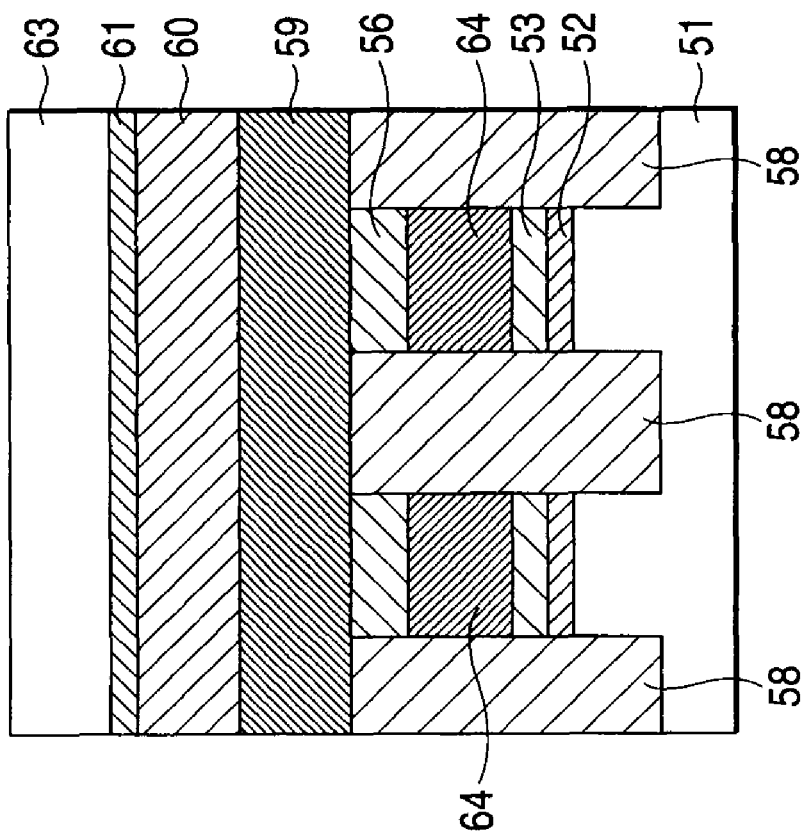
Figure 15B:
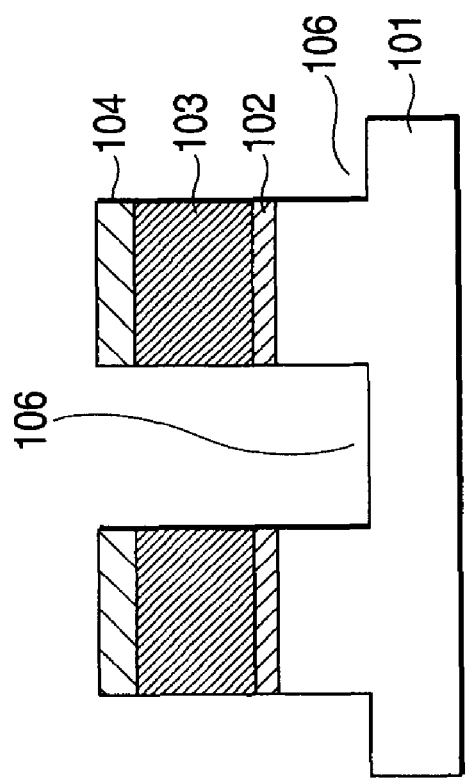
FIGS. 15A and 15B are cross-sectional views showing a process in a method for manufacturing a conventional NAND type nonvolatile memory cell.
Figure 15A:
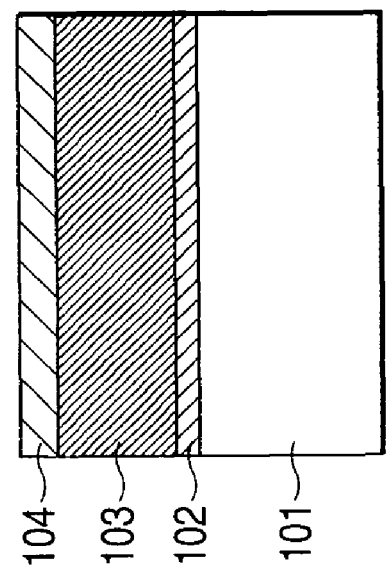

As shown in FIGS. 14A and 14B, next, a silicon oxide film 61 is formed over a side wall of the MONOS gate stack by the CVD method, an ion implantation is then performed on the surface region of the silicon substrate 51 in a self alignment manner, and a high temperature thermal treatment is thereafter performed to form an $n^+$ type source and drain layer 62. Finally, an interlayer insulating film 63 for covering the memory cell is formed by the CVD method. By the thermal treatment for the activation after the ion implantation, Sr diffuses from the Sr oxide layer 54 to the SrCe oxide layer 55 so that a SrCe oxide layer 64 with the compositional inclination is formed.

By the thermal treatment for the activation after the ion implantation, the Sr oxide layer 54 and the SrCe oxide layer 55 are changed into the SrCe oxide inter-electrode insulating film 64 with the compositional inclination due to the following reason. Since the Sr oxide layer 54 is $SrO_{1.8}$ in which Sr is rich and oxygen is poor, a bonding strength between Sr and oxygen is weak and Sr easily diffuses into the SrCe oxide layer 55 so that the single layer of SrCe oxide 64 with the compositional inclination. The phenomenon has been found for the first time by the inventors. The composition of Ce/Sr in the region contacting with the charge storage layer is 0.05, the composition of Ce/Sr is gradually increased toward the control electrode, and the composition of Ce/Sr in the region contacting with the control electrode is 0.90. In the SrCe oxide layer with the composition inclination, it has been confirmed that crystallization, inter-diffusion of Si and Ce and generation of fixed charges are suppressed, and that film properties are not deteriorated after the thermal treatment.

In the embodiment, the composition of Ce/Sr in the region contacting with the charge storage layer formed by the silicon nitride film is set to be 0.05. It has been experimentally confirmed that, when an insulating material including Si is used for the charge storage layer, the composition of Ce/Sr in the region contacting with the charge storage layer is desirably lower than 0.1 in order to prevent inter-diffusion of Si and Ce by contacting them. As a material of the charge storage layer, it is possible to use a silicon oxynitride film, a germanium nitride film, a germanium oxynitride film, a gallium nitride film, a gallium oxynitride film, an aluminum nitride film and an aluminum oxynitride film and etc. If Si is not contained in the charge storage layer in the region contacting with the inter-electrode insulating film, the composition of Ce/Sr does not need to be lower than 0.1 in the region contacting with the charge storage layer. Even if the composition of Ce/Sr is approximately 0.2 to 0.3, there is no problem. However, in order to avoid crystallization, it is essential to introduce the compositional inclination into the SrCe oxide layer. In order to reduce a leakage current, moreover, it has been found that the average composition of Ce/Sr is properly set to be 0.6 to 0.9 in the same manner as in the first embodiment.

The amorphous SrCe oxide film with the compositional inclination which is formed by the method described above in detail has EOT of 4 nm with a physical thickness of 20 nm and a dielectric constant of 20. It has been confirmed that a sufficient performance can be obtained in writing, erasing, reading, and retaining (storing) operations in an MONOS memory cell fabricated by the method. A breakdown voltage of a block insulating film is high, that is, 35 MV/cm or more, and furthermore, leakage current density during writing and erasing operations is $5 \times 10^{-3}$ $A/cm^2$, and the device specifications can be fully satisfied.

(First Modification)

As TiN is used as the control gate electrode material in the second embodiment, it is possible to use materials with large work function such as metal silicide, conductive metal nitride or conductive metal oxide as a conductive material including metal in order to reduce leakage current from the block insulating film to the control gate electrode EOTS. By using a conductive material including no Si, the composition of Ce/Sr in the region contacting with the control gate electrode can be increased, and it is advantageous in respect of the decrease in EOTs. On the other hand, when the metal silicide is used, it is desirable that the composition of Ce/Sr in the region contacting with the control gate electrode is reduced to be approximately 0.5 or less. It is possible to use silicide including W, Mo, Co or Ni as the metal silicide. Moreover, it is also possible to utilize a laminated structure of the control gate electrode in which a conductive material including Si (conventional material) is formed on a conductive material including metal such as metal silicide.

As the SrCe oxide is used as an inter-electrode insulating film in the embodiment, it is also possible to use rare earth oxide and rare earth oxynitride which contain rare earth elements and a one or more elements selected from Al, Ti, Zr, Hf, Ta, Mg, Ca, Sr and Ba which are added to stabilize a bonding state of the rare earth element by enhancing moisture resistance. The rare earth elements contain 17 elements, that is, La, Ce, Pr, Nd, Pm, Sm, Eu, Gd, Tb, Dy, Ho, Er, Tm, Yb, Lu, Sc and Y.

The typical NAND nonvolatile memory devices with floating gate electrode or the charge storage layer have been described in the two embodiments. However, the invention is not restricted to the NAND type nonvolatile memory cells but can be applied to various nonvolatile memory cells having an insulating film in contact with a gate electrode, that is, an NOR type, an AND type, a DINOR type and an NANO type and so on.

The skilled in the art can reach various change and modification examples within the thought of the invention, and it can be understood that the change examples and the modification examples can also belong to the scope of the invention.

What is claimed is:

1. A nonvolatile semiconductor memory device comprising:
    a semiconductor region of a first conductive type;
    source and drain regions of a second conductive type;
    a channel region formed between the source and drain regions;
    a tunneling insulating film formed on the channel region;
    a floating gate electrode formed on the tunneling insulating film, the floating gate electrode including silicon;
    an inter-electrode insulating film formed on the floating gate electrode; and
    a control gate electrode formed on the inter-electrode insulating film,
    wherein an interface between the inter-electrode insulating film and the floating gate electrode is defined as a first interface, and an interface between the inter-electrode insulating film and the control gate electrode is defined as a second interface,
    wherein the inter-electrode insulating film includes one or more first elements, one or more second elements, and oxygen, and,
    wherein the first element is selected from rare earth elements, and the second element is selected from Al, Ti, Zr, Hf, Ta, Mg, Ca, Sr and Ba,
    wherein a composition ratio of the first element to the second element, which is defined as the number of atoms of the first element divided by that of the second element, is different between the first interface and the second interface,
    wherein the composition ratio of the first element to the second element in the inter-electrode insulating film in the vicinity of the second interface is equal to or less than 0.9, and
    wherein the composition ratio of the first element in the inter-electrode insulating film in the vicinity of the first interface is lower than that in the vicinity of the second interface.

2. The device according to claim 1, wherein the inter-electrode insulating film is amorphous.

3. The device according to claim 2, wherein an average composition in the inter-electrode insulating film, which is defined as the total number of atoms of the first element divided by that of the second element, is not equal to one.

4. The device according to claim 2, wherein an average composition in the inter-electrode insulating film, which is defined as the total number of atoms of the first element divided by that of the second element, is from 0.6 to 0.9.

5. The device according to claim 4,
wherein the floating gate electrode contains a conductive material including Si at a region contacting with the inter-electrode insulating film,
wherein the control gate electrode includes a conductive material including metal, and
wherein the composition of the first element in the inter-electrode insulating film, which is defined as the number of atoms of the first element divided by that of the second element, in the vicinity of the first interface, is 0.1 or lower.

6. The device according to claim 4,
wherein the floating gate electrode and the control gate electrode include conductive materials including metal at regions contacting with the inter-electrode insulating film, and
wherein the composition of the first element in the inter-electrode insulating film, in the vicinity of the first and second interfaces, is 0.3 or lower.

7. The device according to claim 4,
wherein the floating gate electrode includes a conductive material including metal at a region contacting with the inter-electrode insulating film,
wherein the control gate electrode includes a conductive material including Si at a region contacting with the inter-electrode insulating film, and
wherein the composition of the first element in the inter-electrode insulating film, in the vicinity of the first interface is 0.3 or lower, and that in the vicinity of the second interface is 0.5 or lower.

8. The device according to claim 4,
wherein the floating gate electrode and the control gate electrode include conductive materials including Si at regions contacting with the inter-layer insulating film, and
wherein the composition of the first element in the inter-electrode insulating film, in the vicinity of the first interface, is 0.1 or lower, and that in the vicinity of the second interface is 0.5 or lower.

9. The device according to claim 4, further comprising an insulating film including Si formed between the floating gate electrode and the first interface of the inter-electrode insulating film,
wherein the control gate electrode includes a conductive material including metal, and
wherein the composition of the first element in the inter-electrode insulating film, in the vicinity of the first interface, is 0.1 or lower.

10. The device according to claim 4, further comprising an insulating film including Si formed between the floating gate electrode and the first interface of the inter-electrode insulating film,
wherein the control gate electrode includes a conductive material including Si at a region contacting with the inter-electrode insulating film, and
wherein the composition of the first element in the inter-electrode insulating film, in the vicinity of the first interface, is 0.1 or lower, and the composition of the first element in the inter-electrode film, in the vicinity of the second interface, is 0.5 or lower.

11. The device according to claim 1, wherein:
the control gate includes silicon;
the composition ratio of the first element to the second element in the inter-electrode insulating film in the vicinity of the second interface is equal to or less than 0.5; and
the composition ratio of the first element to the second element in the inter-electrode insulating film in the intermediate portion between the first interface and the second interface is higher than that in the vicinity of the second interface.

12. A nonvolatile semiconductor memory device comprising:
a semiconductor region of a first conductive type;
source and drain regions of a second conductive type;
a channel region formed between the source and drain region;
a tunneling insulating film formed on the channel region;
a charge storage layer formed on the tunneling insulating film, the charge storage layer including silicon;
a block insulating film formed on the charge storage layer; and
a control gate electrode formed on the block insulating film,
wherein an interface between the block insulating layer and the charge storage layer is defined as a first interface, and an interface between the charge storage layer and the control gate electrode is defined as a second interface,
wherein the block insulating film includes one or more first elements, one or more second elements, and oxygen,
wherein the first element is selected from rare earth elements, and the second element is selected from Al, Ti, Zr, Hf, Ta, Mg, Ca, Sr and Ba,
wherein a composition of the first element to the second element, which is defined as the number of atoms of the first element divided by that of the second element, is different between the first interface and the second interface, and
wherein the composition ratio of the first element to the second element in the inter-electrode insulating film in the vicinity of the second interface is equal to or less than 0.9, and
wherein the composition of the first element in a vicinity of the first interface is lower than that in a vicinity of the second interface.

13. The device according to claim 12, wherein the block insulating film is amorphous.

14. The device according to claim 13, wherein an average composition in the block insulating film, which is defined as the total number of atoms of the first element divided by that of the second element, is not equal to one.

15. The device according to claim 13, wherein an average composition in the block insulating film, which is defined as the total number of atoms of the first element divided by that of the second element, is from 0.6 to 0.9.

16. The device according to claim 15,
wherein the charge storage layer includes a conductive material including Si at a region contacting with the block insulating film,
wherein the control gate electrode includes a conductive material including metal, and
wherein the composition of the first element in the vicinity of the first interface is 0.1 or lower.

17. The device according to claim 15,
wherein the charge storage layer electrode and the control gate electrode include conductive materials including metal at regions contacting with the block insulating film, and wherein the composition of the first element in the vicinity of the first interface is 0.3 or lower.

18. The device according to claim 15,
wherein the charge storage layer includes a conductive material including metal at a region contacting with the block insulating film,
wherein the control gate electrode includes a conductive material including Si at a region contacting with the block insulating film, and
wherein the composition of the first element in the vicinity of the first interface is 0.3 or lower, and the composition of the first element in the vicinity of the second interface is 0.5 or lower.

19. The device according to claim 15,
wherein the charge storage layer and the control gate electrode include conductive materials including Si semiconductor at regions contacting with the block insulating film, and
wherein the composition of the first element in the vicinity of the first interface is 0.1 or lower, and the composition of the first element in the vicinity of the second interface is 0.5 or lower.

20. The device according to claim 12, wherein:
the control gate includes silicon;
the composition ratio of the first element to the second element in the inter-electrode insulating film in the vicinity of the second interface is equal to or less than 0.5; and
the composition ratio of the first element to the second element in the inter-electrode insulating film in the intermediate portion between the first interface and the second interface is higher than that in the vicinity of the second interface.

* * * * *